United States Patent
Tan et al.

(10) Patent No.: US 10,598,853 B2
(45) Date of Patent: Mar. 24, 2020

(54) OPTICAL STRUCTURE AND METHOD OF FORMING THE SAME

(71) Applicants: NANYANG TECHNOLOGICAL UNIVERSITY, Singapore (SG); MASSACHUSETTS INSTITUTE OF TECHNOLOGY, Cambridge, MA (US)

(72) Inventors: Chuan Seng Tan, Singapore (SG); Wei Li, Singapore (SG); P Anantha, Singapore (SG); Kwang Hong Lee, Singapore (SG); Shuyu Bao, Singapore (SG); Lin Zhang, Singapore (SG)

(73) Assignees: NANYANG TECHNOLOGICAL UNIVERSITY, Singapore (SG); MASSACHUSETTS INSTITUTE OF TECHNOLOGY, Cambridge, MA (US)

(*) Notice: Subject to any disclaimer, the term of this patent is extended or adjusted under 35 U.S.C. 154(b) by 0 days.

(21) Appl. No.: 16/079,325

(22) PCT Filed: Feb. 10, 2017

(86) PCT No.: PCT/SG2017/050060
§ 371 (c)(1),
(2) Date: Aug. 23, 2018

(87) PCT Pub. No.: WO2017/151055
PCT Pub. Date: Sep. 8, 2017

(65) Prior Publication Data
US 2019/0033523 A1 Jan. 31, 2019

(30) Foreign Application Priority Data
Feb. 29, 2016 (SG) .......................... 10201601522Q

(51) Int. Cl.
*G02B 6/26* (2006.01)
*G02B 6/122* (2006.01)
(Continued)

(52) U.S. Cl.
CPC .......... *G02B 6/1225* (2013.01); *G02B 6/122* (2013.01); *G02B 6/132* (2013.01);
(Continued)

(58) Field of Classification Search
CPC ........ G02B 6/1225; G02B 6/132; G02B 6/00; G02B 2006/12097; H01L 31/0264; H01L 31/1896; Y02E 10/50
See application file for complete search history.

(56) References Cited

U.S. PATENT DOCUMENTS

| 6,897,498 B2 | 5/2005 | Gothoskar et al. |
| 7,973,377 B2 | 7/2011 | King et al. |

(Continued)

OTHER PUBLICATIONS

Y. Hibino, "Silica-Based Planar Lightwave Circuits and Their Applications," MRS Bulletin, May 2003, pp. 365-371 (2003), 7 pages.
(Continued)

*Primary Examiner* — Ellen E Kim
(74) *Attorney, Agent, or Firm* — Sughrue Mion, PLLC

(57) ABSTRACT

Various embodiments may provide an optical structure. The optical structure may include a substrate. The optical structure may also include a core layer configured to carry optical light. The core layer may include germanium. The optical structure may further include an intermediate layer separating the substrate and the core layer so that the substrate is isolated from the core layer. The intermediate layer may include one or more materials selected from a group consisting of III-V materials, dielectric materials, and chalcogenide materials. A width of the core layer may be smaller (Continued)

than a width of the intermediate layer. A refractive index of the core layer may be more than 4. A refractive index of the intermediate layer may be smaller than 3.6.

20 Claims, 26 Drawing Sheets

(51) Int. Cl.
    *H01L 31/0264* (2006.01)
    *H01L 31/18* (2006.01)
    *G02B 6/132* (2006.01)
    *G02B 6/12* (2006.01)

(52) U.S. Cl.
    CPC ...... *H01L 31/0264* (2013.01); *H01L 31/1896* (2013.01); *G02B 2006/12097* (2013.01); *G02B 2006/12119* (2013.01); *Y02E 10/50* (2013.01)

(56) References Cited

U.S. PATENT DOCUMENTS

| | | | | |
|---|---|---|---|---|
| 2008/0240663 | A1* | 10/2008 | Dong | C03B 37/01211 385/125 |
| 2009/0026436 | A1* | 1/2009 | Song | H01L 45/06 257/3 |
| 2013/0092980 | A1 | 4/2013 | Na et al. | |
| 2013/0285153 | A1* | 10/2013 | Lee | H01L 21/02532 257/369 |
| 2014/0264030 | A1 | 9/2014 | Lin et al. | |
| 2015/0084143 | A1 | 3/2015 | Fujikata et al. | |
| 2015/0226918 | A1 | 8/2015 | Bauters et al. | |
| 2016/0109655 | A1* | 4/2016 | Vurgaftman | G02B 6/122 385/14 |
| 2016/0126434 | A1* | 5/2016 | Nakabayashi | F21S 41/663 315/82 |
| 2016/0358847 | A1* | 12/2016 | Shih | H01L 21/6835 |

OTHER PUBLICATIONS

T. Shibata, M. Okuno, T. Goh, T. Watanabe, M. Yasu, M. Itoh, M. Ishii, Y. Hibino, A. Sugita, and A. Himeno, "Silica-Based Waveguide-Type 16×16 Optical Switch Module Incorporating Driving Circuits," IEEE Phot. Techn. Lett., vol. 15, No. 9, pp. 1300 to 1302, Sep. 2003, 3 pages.

Gian-Luca Bona, R. Germann, and B. J. Offrein, "SiON high-refractive-index waveguide and planar lightwave circuits," IBM J. Res. Develop. Armonk, vol. 47, Iss. 2/3, Mar./May 2003: 239, 15 pages.

Yu-Chi Chang et al., "Low-loss germanium strip waveguides on silicon for the mid-infrared," Opt. Lett., vol. 37, No. 14, pp. 2883-2885, Jul. 15, 2012, 3 pages.

A. Malik et al., "Germanium-on-silicon mid-infrared arrayed waveguide grating multiplexers," IEEE Photon. Technol. Lett., vol. 25, No. 18, pp. 1805-1808, Sep. 15, 2013, 4 pages.

G. Z. Mashanovich et al., "Silicon photonic waveguides and devices for near-and mid-IR applications", IEEE Journal of Selected Topics in Quantum Electronics, Jul./Aug. 2015, vol. 21, No. 4, pp. 1-12, 12 pages.

Shu Nakaharai et al. "Characterization of 7-nm-thick strained Ge-on-insulator layer fabricated by Ge-condensation technique" Appl. Phys. Lett., American Institute of Physics, vol. 83, No. 17, Oct. 27, 2003, 4 pages.

K. H. Lee et al. "Fabrication and characterization of germanium-on-insulator through epitaxy, bonding, and layer transfer" J. of Appl. Phys., vol. 116, 103506 (2014), 6 pages.

Yaocheng Liu, Michael D. Deal, and James D. Plummer "High-quality single-crystal Ge on insulator by liquid-phase epitaxy on Si substrates" Appl. Phys. Lett., vol. 84, No. 14, Apr. 5, 2004, 4 pages.

Vivek Singh et al. "Mid-infrared materials and devices on a Si platform for optical sensing" Sci. Technol. Adv. Mater., vol. 15 (2014) 014603, 16 pages.

Stankovic et al., "Silicon Photonic Waveguides for Near- and Mid-Infrared Regions", Acta Physica Polonica A, vol. 112, No. 5, pp. 1019-1024, Sep. 2007, 6 pages.

Toko, K., Ohta, Y., Tanaka, T., Sadoh, T., and Miyao, M. "Chip-size formation of high-mobility Ge strips on SiN films by cooling rate controlled rapid-melting growth", Applied Physics Letters, vol. 99, 032103, (2011), 4 pages.

Cooke, M., "High-Brightness Nitride LEDs on Silicon Through Wafer Bonding", semiconductorToday, Compounds & Advanced Silicon, Jun. 2011, 2 pages.

Wei Li et al., "Germanium-on-silicon nitride waveguides for mid-infrared integrated photonics", Applied Physics Letters, Dec. 12, 2016, vol. 109, No. 24, pp. 241101-1 to 241101-5, 6 pages.

\* cited by examiner

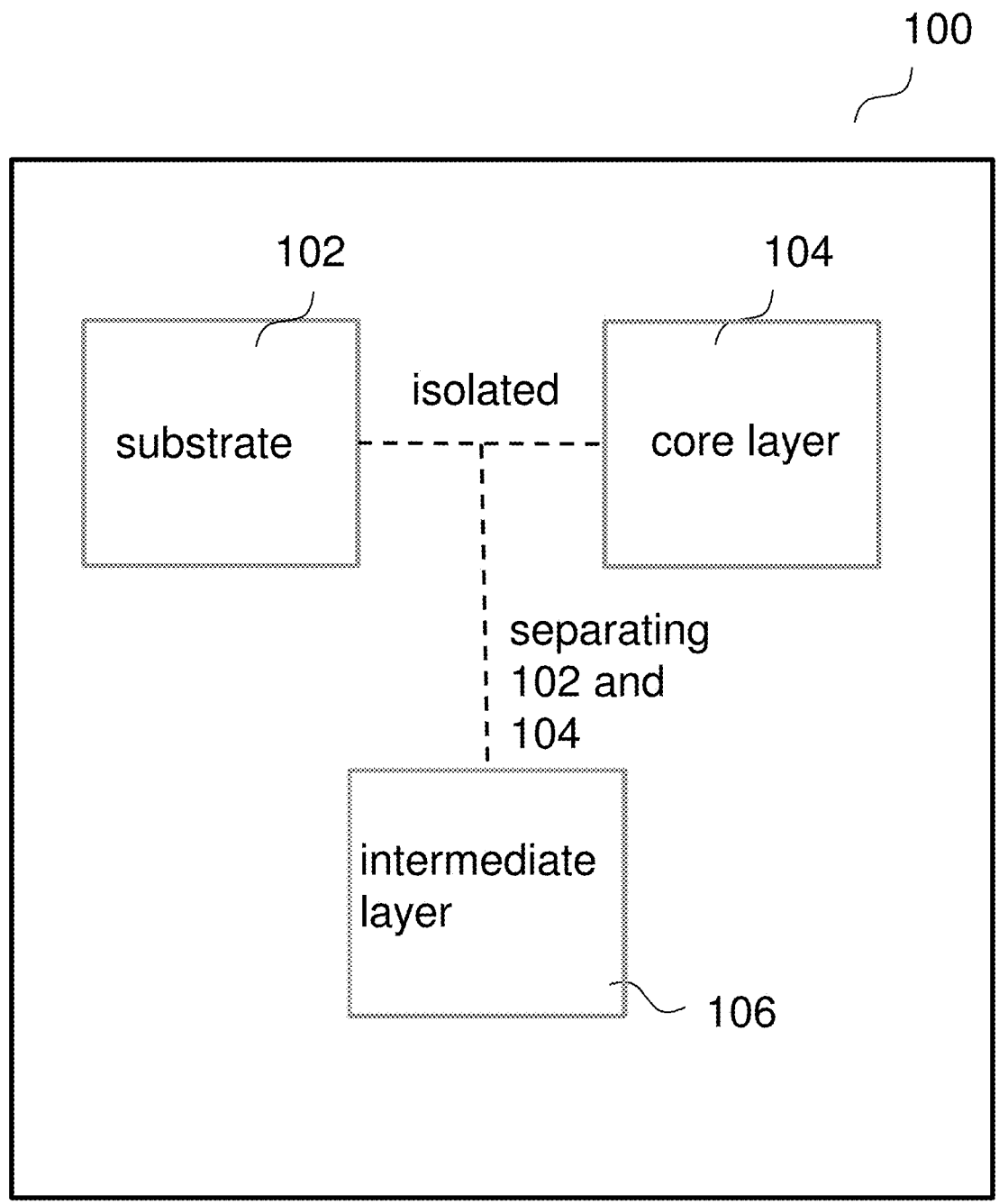

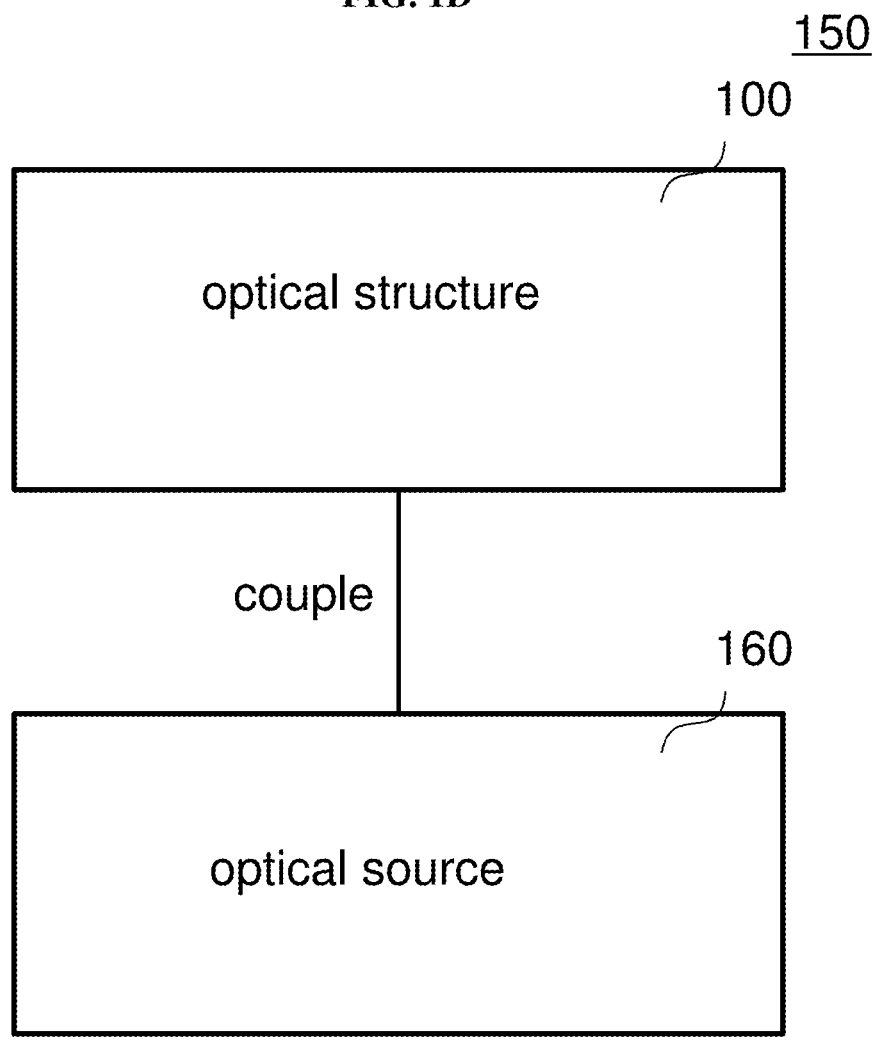

| Material | | Refractive Index (@ 3.8 μm) |
|---|---|---|
| | Germanium | 4.0276 |
| Dielectric materials | SiN | 2.4027 |
| | Al₂O₃ | 1.5722 |
| | AlN | 1.9867 |
| III-V materials | InP | 3.0981 |
| | InAs | 3.5176 |
| | GaAs | 3.3044 |
| | Chalcogenide | 2.4120 |

1300

1400

1500

OPTICAL STRUCTURE AND METHOD OF FORMING THE SAME

CROSS-REFERENCE TO RELATED APPLICATION

This application is a National Stage of International Application No. PCT/SG2017/050060, filed on Feb. 10, 2017, which claims priority from Singapore Application No. 10201601522Q filed on Feb. 29, 2016, the entire contents of each of which are incorporated by reference herein in their entireties for all purposes.

TECHNICAL FIELD

Various aspects of this disclosure relate to optical structures and/or methods of forming optical structures.

BACKGROUND

With the rapid development of technology, the critical size of a transistor has already reached the nanometer range, and the number of transistors on a single chip is unbelievably large (reaching several billions transistors per chip). Metal wires play a very important role in chips because they connect different devices together in a single chip, or they interconnect different chips. However, due to the rapidly increasing number of transistors on a single chip and the increasingly complexity of chip design, the total length of metal wire needs to continuously increase, resulting in an increase in total resistance. Therefore, the signal delay and the power consumption of chips have become very critical challenges in today's semiconductor technology. Further, the capability of electrons to carry information is not as good as the photons. These factors result in an increased interest to utilize optical interconnection to replace metal wires to connect different devices and chips. The utilization of optical interconnections may lead to an increase in the capability to transmit huge volumes of information in the chips as well as lower power consumption. The rapid development of photonic components requires a high level integration so that different photonic components can form a system to realize a certain function. Consequently, silicon photonics has become a highly promising research field in the last several years.

Silicon photonics research also includes fundamental passive components such as waveguides. Integration of discrete photonic components into a single chip is a long-standing goal of integrated optics. In earlier reports of silica-on-silicon technology, the waveguide was formed in a silica layer by doping it with phosphorous (P) or germanium (Ge) atoms. An impressive level of integration, e.g. a 16×16 switch array on a single 6 inch silicon wafer, may be reached based on this technology. However, further increase in the integration density with this technology is restricted by the large minimal bending radius of silica waveguides, which is in the order of a few centimeters.

A significant step toward much denser integration has been demonstrated with silicon oxynitride (SiON) technology. A much higher index contrast is introduced between the core of the SiON waveguide and silica cladding, which allows the minimum bending radius to be reduced to below 1 mm. Further, Aggressive scaling is introduced by silicon-on-insulator (SOI) technology, which involves forming the waveguide in a thin silicon layer. The extremely high refractive index contrast between the silicon core (n=3.5) and silica cladding layer (n=1.45) allows the waveguide core to be shrunk down to a submicron cross-section, while still maintaining single mode propagation at about 1.3 microns to about 1.5 microns telecommunications wavelengths. Such extreme light confinement allows the minimal bending radius to be reduced to the micron range.

SOI platform almost focuses on telecommunication wavelength which is about 1550 to about 2000 nm. However, silicon and germanium are transparent up to about 8 and about 15 µm, respectively, thus offering a range of applications in biochemical and environmental sensing, medicine, astronomy and communications. The major problem with a transition to the mid-infrared (MIR, about 2 µm to about 20 µm) is that SOI can be used only up to about 4 µm, due to the high absorption loss of silicon dioxide.

Therefore, alternative material platforms have to be utilized for longer wavelengths. Germanium-on-silicon (Ge-on-Si) platform has been proposed and demonstrated to be workable because the transparency of Ge extends to about 15 µm. Two micrometer thick strip Ge-on-Si waveguides with losses of about 3 dB/cm were first reported by Change et al. ("Low-loss germanium strip waveguides on silicon for the mid-infrared," Opt. Lett., vol. 37, pp. 2883-2885, 2012). Similar losses for the same structure, at a similar wavelength range, were also reported by Malik et al. ("Germanium-on-silicon mid-infrared arrayed waveguide grating multiplexers," IEEE Photon. Technol. Lett., vol. 25, no. 18, pp. 1805-1808, September 2013). These waveguides have been characterized to have a wavelength range of about 2 to about 2.6 µm.

Researchers at the University of Southampton have come up with a Ge-on-Si rib waveguide platform configured to carry light having a wavelength of about 3.8 µm. The waveguides were designed to have an etch depth of about 1.2 µm and a core width of about 2.25 µm. The propagation loss of these waveguides was measured by the cut back method giving a low loss of about 2.4±0.2 dB/cm at a wavelength of about 3.8 µm, which is claimed to be the lowest reported loss for Ge on Si waveguides structures (Mashanovich G Z et al. Silicon photonic waveguides and devices for near-and mid-IR applications, Selected Topics in Quantum Electronics, IEEE Journal of, 2015, 21(4): 1-12).

Ge-on-Si can extend the applicable wavelength to the mid-IR range. However, one challenge is that the refractive index contrast between Ge (n=4.1) and Si (n=3.4) is not larger than that of SOI. As such, the radius of the bend part of the waveguides cannot be as small as a micron. Normally, a sensing chip is desired to be as small as possible so that the chip would not occupy large spaces in systems or devices. SOI cannot be used in sensing applications and Ge-on-Si cannot provide a compact design of waveguides.

SUMMARY

Various embodiments may provide an optical structure. The optical structure may include a substrate. The optical structure may also include a core layer configured to carry optical light. The core layer may include germanium. The optical structure may further include an intermediate layer separating the substrate and the core layer so that the substrate is isolated from the core layer. The intermediate layer may include one or more materials selected from a group consisting of III-V materials, dielectric materials, and chalcogenide materials. A width of the core layer may be smaller than a width of the intermediate layer. A refractive index of the core layer may be more than 4. A refractive index of the intermediate layer may be smaller than 3.6.

Various embodiments may provide a method of forming an optical structure according to various embodiments. The method may include providing a substrate. The method may further include forming a core layer configured to carry optical light, the core layer including germanium. The method may additionally include forming an intermediate layer separating the substrate and the core layer so that the substrate is isolated from the core layer, the intermediate layer including one or more materials selected from a group consisting of III-V materials, a dielectric materials, and chalcogenide materials. A width of the core layer may be smaller than a width of the intermediate layer. A width of the core layer may be smaller than a width of the intermediate layer. A refractive index of the core layer may be greater than 4. A refractive index of the intermediate layer may be smaller than 3.6.

BRIEF DESCRIPTION OF THE DRAWINGS

The invention will be better understood with reference to the detailed description when considered in conjunction with the non-limiting examples and the accompanying drawings, in which:

FIG. 1A is a general illustration of an optical structure according to various embodiments.

FIG. 1D is a general illustration of an optical system according to various embodiments.

FIG. 12 is a table showing several materials which may be used in the optical structure according to various embodiments.

DETAILED DESCRIPTION

Figure 1B:
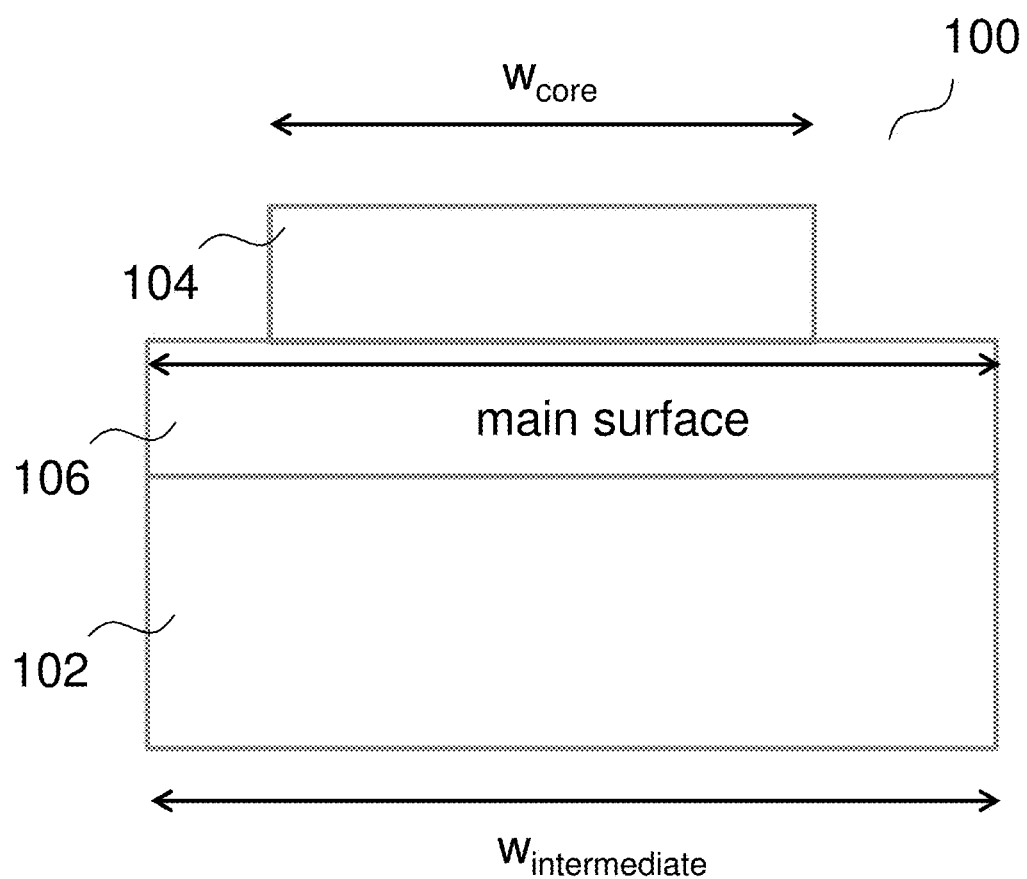
FIG. 1B is a schematic showing a cross-sectional side view of an optical structure according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or optical devices/optical systems are analogously valid for the other methods or optical devices/optical systems. Similarly, embodiments described in the context of a method are analogously valid for an optical device/optical system, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers.

The device arrangement as described herein may be operable in various orientations, and thus it should be understood that the terms "top", "bottom", etc., when used in the following description are used for convenience and to aid understanding of relative positions or directions, and not intended to limit the orientation of the device arrangement.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

FIG. 1A is a general illustration of an optical structure 100 according to various embodiments. The optical structure 100 may include a substrate 102. The optical structure 102 may also include a core layer 104 configured to carry optical light. The core layer 104 may include germanium. The optical structure 102 may further include an intermediate layer 106 separating the substrate 102 and the core layer 104 so that the substrate 102 is isolated from the core layer 104. The intermediate layer 106 may include one or more materials selected from a group consisting of III-V materials, dielectric materials, and chalcogenide materials. A width of the core layer 104 may be smaller than a width of the intermediate layer 106 depending on the required applications. A refractive index of the core layer 104 may be more than 4. A refractive index of the intermediate layer 106 may be smaller than 3.6.

In other words, the optical structure 100 may include a substrate 102, an intermediate layer 106 over the substrate 102, and a core layer 104 over the intermediate layer 106. The intermediate layer 106 may separate the core layer 104 from the substrate 102. The core layer 104 may include germanium, and the intermediate layer 106 may include a material such as a III-V material, a dielectric material and/or a chalcogenide material. The lateral with of the core layer 104 is smaller than the lateral width of the intermediate layer 106. There may be a difference in the refractive index of the core layer 104 and the refractive index of the intermediate layer 106 to effectively confine light.

Various embodiments may seek to address or mitigate the various issues faced by conventional waveguides. Various embodiments may be configured to carry optical light of a longer wavelength compared to the optical light that can be carried by conventional waveguides. Various embodiments may relate to an optical structure 100 including a core layer 104 which carries mid-infrared light (MIR), which may have a wavelength selected from a range of 2 µm to about 20 µm, e.g. about 2 µm to about 15 µm. Various embodiments may be used for applications in MIR range. Various embodiments may provide a large refractive index contrast and thus a denser integration. Various embodiments may be configured to effectively confine optical light, e.g. mid infrared light due to the difference in refractive index between the core layer 104 and the intermediate layer 106. Various embodiments may introduce a suitable material between Ge and Si to obtain a compact structure, such as III-V materials, dielectric materials, and/or chalcogenide materials.

The intermediate layer 106 may be referring to as an under-cladding layer, and the one or more materials comprised in the intermediate layer 106 may be referring to as under-cladding material(s). The core layer 104 may be also referred to as a guiding layer.

The values of the refractive indexes as described herein may be measured or determined based on a mid-infrared light of 3.8 µm.

In various embodiments, the material may be silicon nitride (SiN), given its large optical transparency in the mid-IR region. In various embodiments, the optical structure 100 may be germanium-on-silicon nitride (Ge-on-SiN). In other words, the core layer 104 may be or may include Ge, and the intermediate layer 106 may be or may include SiN. The refractive index of silicon nitride may be 2.4 and silicon nitride may be transparent up to about 7 µm, so the refractive index contrast between Ge (core material) and SiN (under-cladding material) may be comparable to that of Si and $SiO_2$.

Simulation results have demonstrated that Ge-on-SiN may provide a more compact integration, allowing the radius of bend to reach a micron range, and the cross-section size of the waveguide to be smaller than that of Ge-on-Si. In various embodiments, the optical structure may have a bent portion with a bending radius of about 10 µm or less, e.g. about 5 µm or less, e.g. about 3 µm or less, e.g. about 2 µm or less. In various embodiments, the optical structure may have a bent portion with a bending radius of about 3 µm or less, e.g. about 2 µm or less, and with a transmission of 0.95 or more. The transmission of light may vary from 0 to 1, with 0 representing zero transmission and 1 representing perfect transmission.

In various embodiments, the optical structure may be a passive device such as a waveguide (e.g. a ridge waveguide or a rib waveguide), a ring resonator, or a chemical sensing device. In various other embodiments, the optical structure may be an active device such as a photodetector, a modulator or a light source.

In addition, various embodiments may relate to method based on a wafer bonding and layer transfer methodology to form the Ge-on-SiN structure. Various embodiments may relate to an optical structure formed by any method described herein.

Alternatively, the material may be other dielectric materials such as, for example, aluminum oxide ($Al_2O_3$) or aluminum nitride (AlN). In other words, the dielectric materials may include or consist of silicon nitride (SiN), aluminum oxide ($Al_2O_3$), and aluminum nitride (AlN).

A III-V material may be defined as or may refer to a compound with at least one Group III element and at least one group V element. In various embodiments, the III-V materials may include or consist of indium phosphide (InP), indium arsenide (InAs), and gallium arsenide (GaAs).

A chalcogenide material may be defined as or may refer to a compound including at least one chalcogen anion and at least one electropositive element. A chalcogen may refer to a Group VI element. The chalcogenide material may include, but is not limited to, any one of titanium selenide ($TiSe_2$), zinc sulfide (ZnS), arsenic trisuphide ($As_2S_3$), arsenic triselenide ($As_2Se_3$) and iron pyrite ($FeS_2$).

In various embodiments, the core layer 104 may include only germanium element. In various other embodiments, the core layer 104 may include an alloy of germanium, such as germanium tin (GeSn). In other words, the core layer 104 may further include tin (Sn). The germanium element or alloy of germanium may be referred to as core material(s).

In various embodiments, the substrate 102 may include a suitable semiconductor such as silicon.

In various embodiments, the core layer 104 may be in contact with the intermediate layer 106. In various embodiments, the core layer 104 may be on the intermediate layer 106.

FIG. 1B is a schematic showing a cross-sectional side view of an optical structure 100 according to various embodiments. As shown in FIG. 1B, the core layer 104 may be on the intermediate layer 106, and the intermediate layer 106 may be on the substrate 102.

Figure 1C:
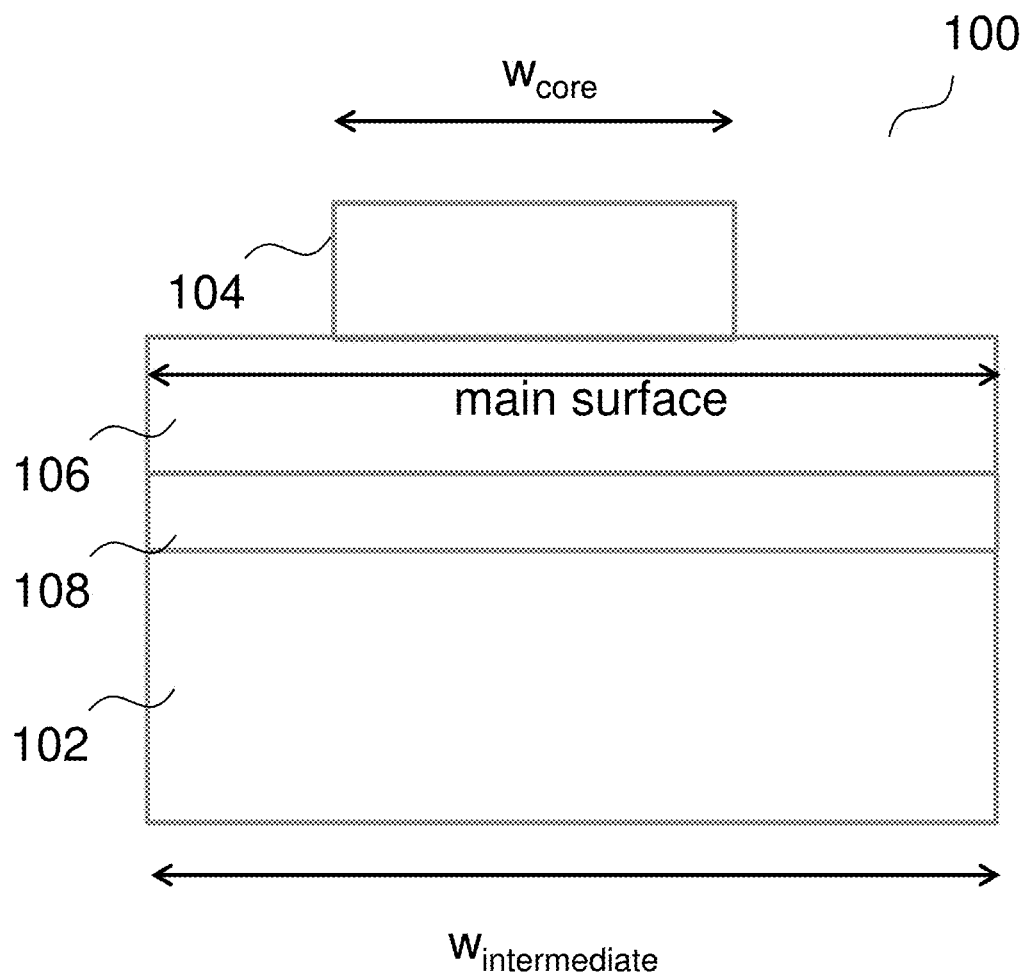
FIG. 1C is a schematic showing a cross-sectional side view of the optical structure according to various other embodiments.

FIG. 1C is a schematic showing a cross-sectional side view of the optical structure 100 according to various other embodiments. As shown in FIG. 1C, the core layer 104 may be on the intermediate layer 106, and the intermediate layer 106 may be over the substrate 102. The optical structure 100 may further include a buffer layer 108. The buffer layer may include or consist of silicon oxide ($SiO_2$). The buffer layer 108 may be on the substrate 102, and the intermediate layer 106 may be on the buffer layer 108.

Further, as shown in FIGS. 1B and 1C, a width of the core layer 104 ($w_{core}$) may be smaller than a width of the intermediate layer 106 ($w_{intermediate}$). The width of the core layer 104 ($w_{core}$) (may refer to the dimension along a surface of the core layer 104 that is parallel to a main surface of the substrate 102 (indicated in FIGS. 1B and 1C as main surface). Similarly, the width of the intermediate layer 106 ($w_{intermediate}$). may refer to the dimension along a surface of the intermediate layer 106 ($w_{intermediate}$). that is parallel to the main surface of the substrate 102. The core layer 102, the intermediate layer 106 and the substrate 102 may form a vertical arrangement. The width of the core layer 104 and/or the width of the intermediate layer 106 may extend laterally.

In various embodiments the core layer 104 may be configured to carry optical light of a single mode.

In various embodiments, a thickness of the core layer 104 may be a value selected from a range of 0.5 μm to 2 μm, e.g. about 1 μm. In various embodiments, a thickness of the intermediate layer is a value selected from a range of 0.5 μm to 20 μm, e.g. about 1 μm. In various embodiments, a width of the core layer 104 may be substantially equal or less than 2 μm.

Various embodiments may provide an optical system. FIG. 1D is a general illustration of an optical system 150 according to various embodiments. The optical system 150 may include an optical structure 100 as described herein. The optical system 150 may also include an optical source 160 coupled to the optical structure 100. The optical source 160 may be configured to provide optical light to the optical structure 100. The optical light may be optically coupled from the optical source 160 to the optical structure 100.

Figure 2:
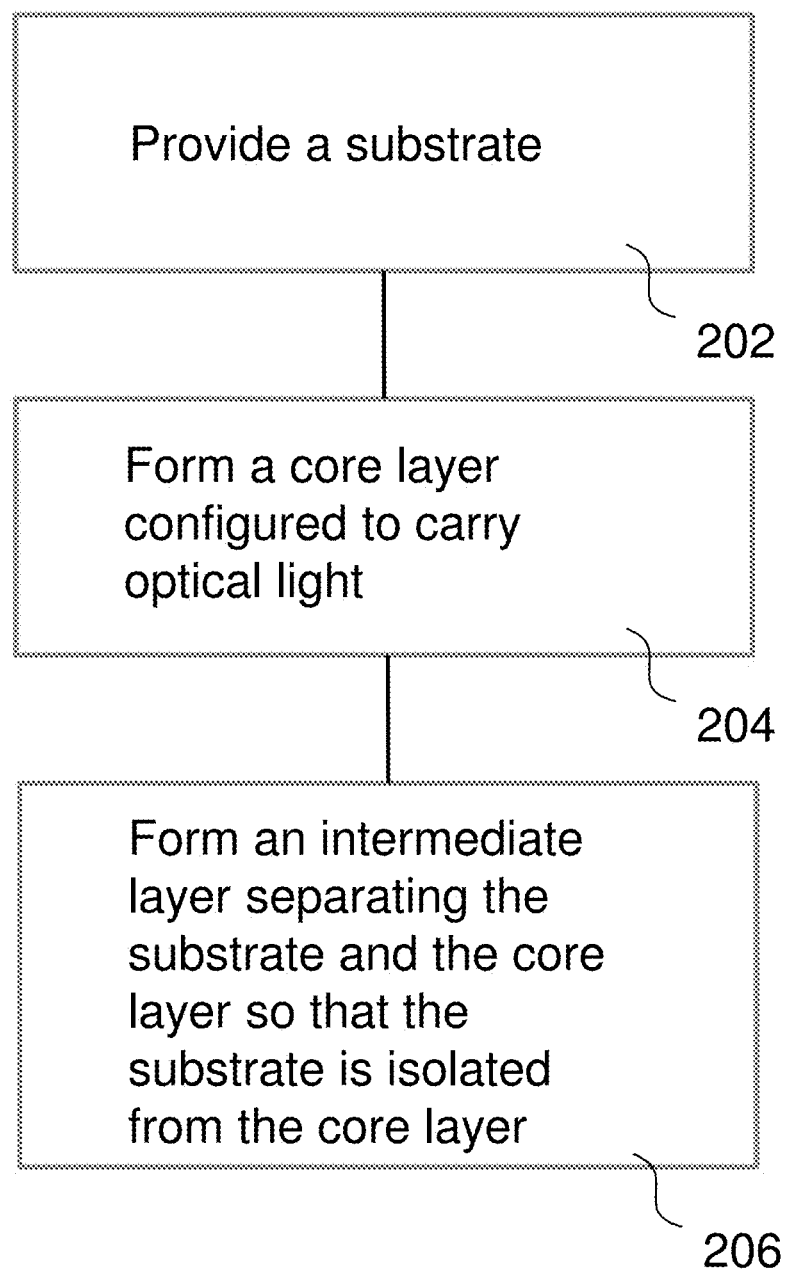
FIG. 2 is a schematic showing a method of forming an optical structure according to various embodiments.

FIG. 2 is a schematic 200 showing a method of forming an optical structure according to various embodiments. The method may include, in 202, providing a substrate. The method may further include, in 204, forming a core layer configured to carry optical light, the core layer including germanium. The method may additionally include in 206, forming an intermediate layer separating the substrate and the core layer so that the substrate is isolated from the core layer, the intermediate layer including one or more materials selected from a group consisting of III-V materials, a dielectric materials, and chalcogenide materials. A width of the core layer may be smaller than a width of the intermediate layer. A width of the core layer may be smaller than a width of the intermediate layer. A refractive index of the core layer may be greater than 4. A refractive index of the intermediate layer may be smaller than 3.6.

In other words, the method may include forming the core layer and the intermediate layer over the substrate. The core layer may have a refractive index greater than 4, while the intermediate layer may have a refractive index smaller than 3.6.

In various embodiments, the method may be based on a wafer bonding and layer transfer methodology. Wafer bonding and layer transfer may reduce the number of defects at the interface, provide lower threading dislocation density, provide ease of scalability, allows for a core layer with low surface roughness and/or reduce tensile stain.

The core layer may be formed on or over a carrier, which may refer to as a temporary wafer. The core layer may be formed by depositing the Ge element or Ge-based alloy on or over the carrier via a chemical vapour deposition (VD) process or plasma enhanced chemical vapour deposition (PECVD) process. The carrier may be a silicon wafer.

The intermediate layer may be formed on the core layer. The intermediate layer may be formed by depositing the one or more materials on the core layer via a chemical vapour deposition (VD) process or plasma enhanced chemical vapour deposition (PECVD) process. The method may further include carrying out a post deposition anneal to ensure release of gases trapped during deposition.

The method may further include forming a further layer is formed on the carrier so that the carrier is between the intermediate layer and the further layer. In other words, the intermediate layer may be formed on a first side of the carrier, while the further layer may be formed on a second side of the carrier opposite the first side. The method may further include carrying out a post deposition anneal to ensure release of gases trapped during deposition. The further layer may help compensate for bowing effect.

A material comprised in the further layer may be same as a material comprised in the intermediate layer. For instance, the intermediate layer and the further layer may include silicon nitride.

The method may further include forming a buffer layer on the intermediate layer. The buffer layer may include or consist of silicon oxide ($SiO_2$). The buffer layer may be formed on the intermediate layer via a low temperature PECVD process. The method may also include reducing the buffer layer to a predetermined thickness, e.g. about 100 nm, via a chemical mechanical polishing (CMP) process. The buffer layer may serve as a bonding layer for ease of bonding with the substrate, which may be referred to as a handle wafer.

The method may further include bonding the substrate to the buffer layer. The method may include bringing the substrate and the stacked arrangement (including the carrier, the core layer, the intermediate layer, the further layer, and the buffer layer together), so that the substrate may contact the buffer layer.

Before bonding, the substrate and the stacked arrangement may be exposed to a plasma, e.g. an oxygen ($O_2$) plasma, to improve the hydrophilicity of the bonding surfaces.

The method may further include annealing the bonded stacked arrangement and substrate for improving bonding strength.

The method may additionally include removing the carrier after bonding. The carrier (and the further layer) may be removed by mechanical grinding, followed by wet etching. In other words, the carrier (and the further layer) may be removed using mechanical grinding and wet etching.

The method may also include patterning the core layer, for instance by using electron beam (e-beam) lithography and/or optical lithography so that the width of the core layer is smaller than the width of the intermediate layer.

Various embodiments may also provide forming an optical system. The method may include coupling an optical source to an optical structure as described herein.

Various embodiments may relate to a compact optical structure formed by introducing a suitable material between Ge and Si. In order to verify the feasibility of adding a layer of SiN between the core layer and the silicon substrate to provide high refractive index contrast, Lumerical Finite Difference Time Domain (FDTD) may be utilized.

Various embodiments may include a silicon nitride layer (or any other suitable material) between the guiding layer (or core) and substrate. Various embodiments may be used in sensing applications without the constraint that a buried oxide layer would absorb the mid-IR waves, and may further provide a large refractive index contrast allowing the design of systems, chips, and/or devices in a more compact manner.

The silicon nitride layer (or any other suitable material) between Ge core layer and Si substrate may provide a large refractive index contrast which may reduce the bending radius, i.e. radius of the bend, to a micron range, therefore allowing the design of a more compact system. Considering that many handheld devices or other devices have a limited space, a small sensing chip may provide the flexibility for the device to accommodate other chips and/or parts of the system. Silicon substrate may be preferred compared to other substrates due to economic reasons. Further, silicon may be easily used for scale-up and may also be highly compatible with processing tools in foundries.

The layer transfer method may have advantages. If Ge is deposited directly on the Si substrate, there may be many defects at the Ge/Si interface because of the lattice mismatch. By utilizing the layer transfer method, the Ge/Si interface between the Ge core layer and the silicon carrier may be available for modification. This may allow the interface with defects to be polished away by chemical mechanical polishing (CMP). This may provide a high quality Ge layer as one now has the flexibility to engineer the Ge layer. A high quality guiding core may thus reduce the propagation loss further.

Ge-on-SiN may have a larger refractive index contrast than that of Ge-on-Si, which may provide allow for smaller bends and thus a more compact design. Further, various embodiments using layer transfer technology to realize Ge guiding layer onto the silicon nitride layer may provide a high quality of guiding layer. The propagation loss may also be reduced, and the performance of the waveguides may be improved remarkably.

In various embodiments, dielectric bonding may be used. With careful surface preparation, bonding may take place at room temperature with negligible pressure instantaneously. This may have a very significant impact on the mechanical stress and reliability of the final wafers, as well as the process time. Bonded dielectrics may be more thermally stable compared to bonded metals.

In addition, various embodiments may allow large wafer size realization. Wafers of about 200 mm sizes have been processed using the method according to various embodiments and as described herein. The method as described herein may be extendable to about 300 mm. Having a large wafer size may improve the manufacturing throughput, and therefore lower the final cost.

Figure 3A:
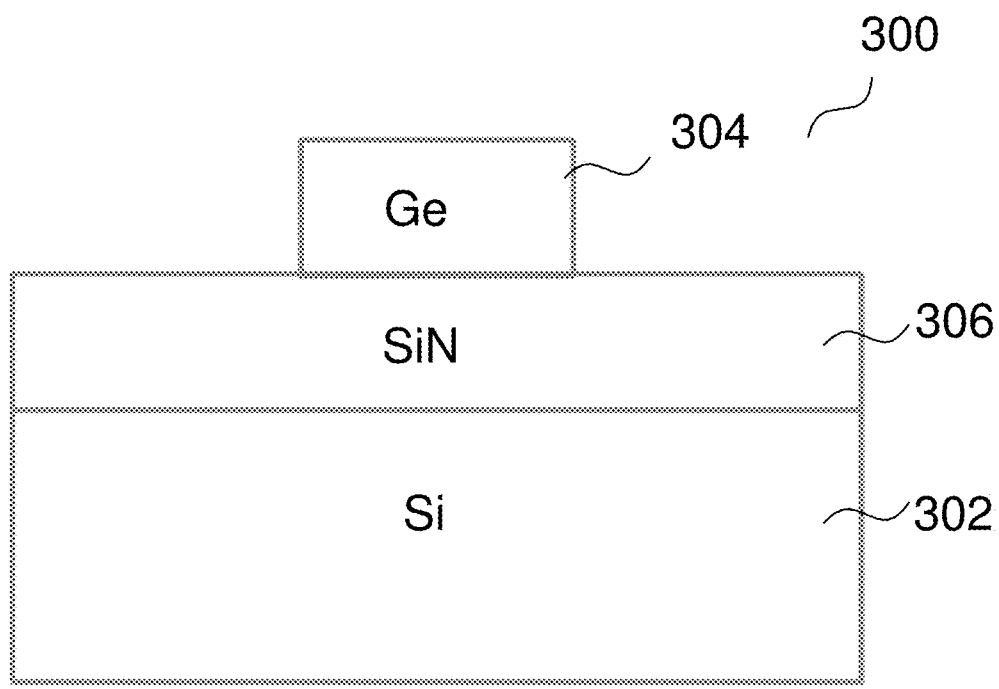
FIG. 3A is a schematic showing a cross-sectional side view of an optical structure according to various embodiments.

FIG. 3A is a schematic showing a cross-sectional side view of an optical structure 300 according to various embodiments. The optical structure 300 may include a silicon (Si) substrate 302, a silicon nitride (SiN) layer 306 on the Si substrate 302, and a germanium (Ge) core layer 304 on the SiN layer 306.

Figure 3B:
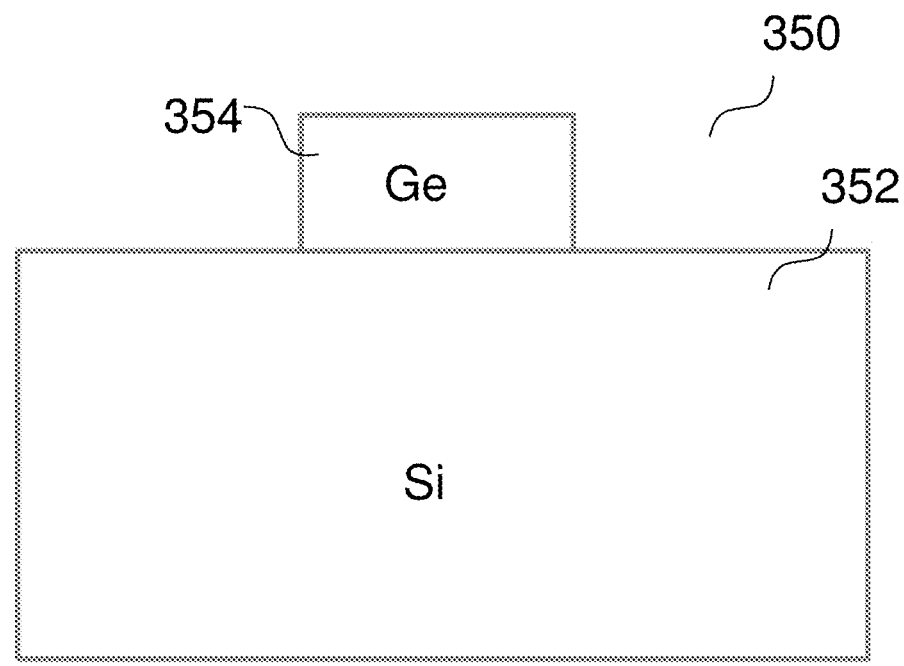
FIG. 3B is a schematic showing a cross-sectional side view of a conventional germanium on silicon (Ge-on-Si) optical structure.

FIG. 3B is a schematic showing a cross-sectional side view of a conventional germanium on silicon (Ge-on-Si) optical structure 350. The structure 350 may include a silicon (Si) substrate 352, and a germanium (Ge) core layer 354 on the Si substrate 352.

The structures illustrated in FIGS. 3A and 3B are used in the simulation.

The SiN layer 306 is about 1 µm, and may be thick enough so the underlying silicon oxide buffer layer does not absorb light. As the silicon oxide layer is used only during processing for layer transfer and may be thin (e.g. about 100 nm), its influence may be ignored in the simulation, and it is not shown in FIG. 3A.

The dimensions of the Ge waveguides 304, 354 are the same so as to illustrate the impact of the SiN layer 306 without any influence due to different sizes of the waveguides 304, 354. The thickness of the Ge layers 304, 354 is about 1 µm.

A single mode transmission in the waveguides may be desired as it results in low propagation loss and signal distortion. Accordingly, appropriate dimensions of the waveguides 304, 354 are chosen in order to obtain only a single mode in the waveguides 304, 354. Further, as the interests may be focused primarily on applications in the mid-IR region, sources of about 2 µm and about 3.8 µm wavelengths were utilized to carry out the simulation.

The width of the waveguides 304, 354 is varied from about 0.5 µm to about 2 µm to observe the width at which a second mode would be activated.

The simulation results show that when the width of the waveguides 304, 354 is larger than about 2 µm, the second mode is activated at about 3.8 µm wavelength. Accordingly, the width of the waveguides 304, 354 is set at about 2 µm.

Figure 4A:
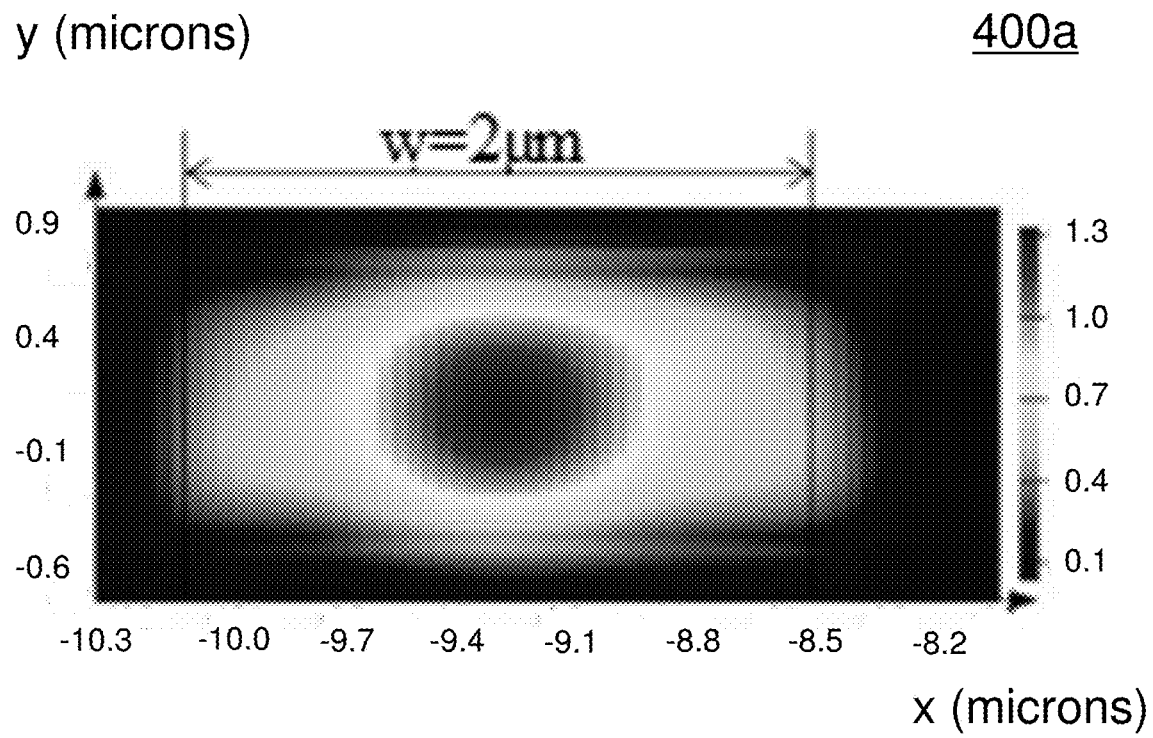
FIG. 4A is a plot of y dimension (in microns) as a function of x dimension (in microns) of a waveguide showing a mode profile at a wavelength of about 2 μm according to various embodiments.
Figure 4B:
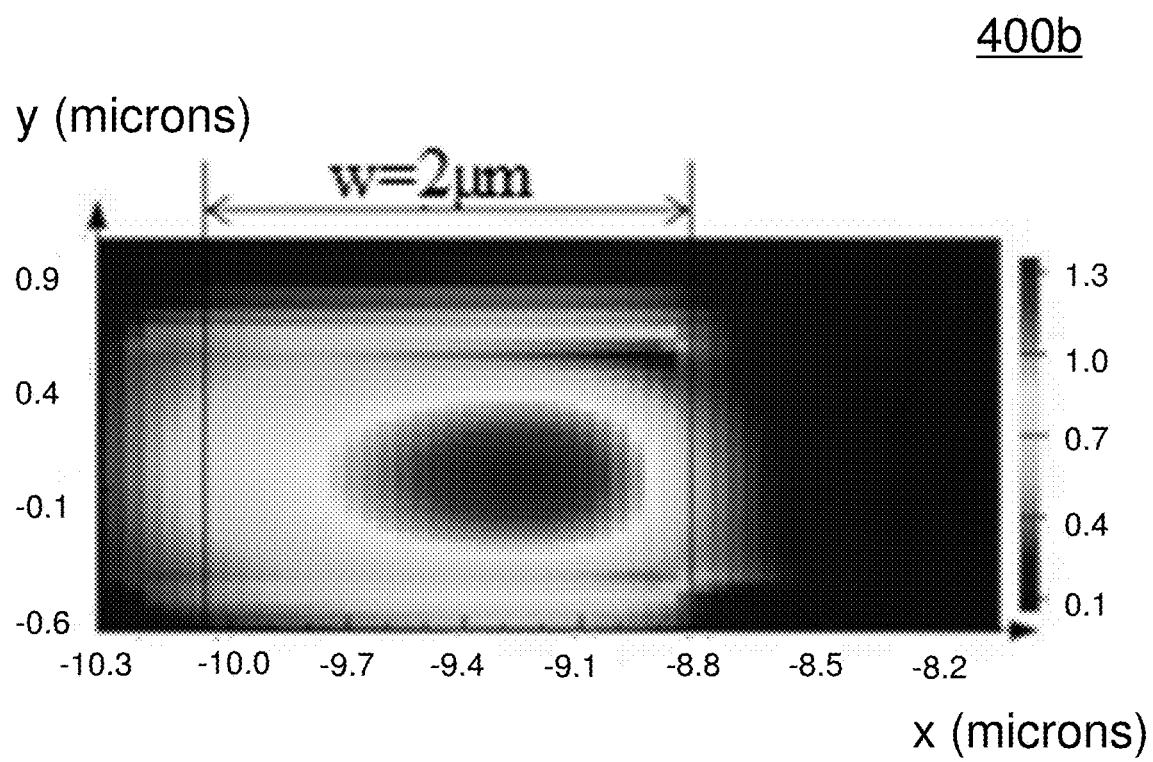
FIG. 4B is a plot of y dimension (in microns) as a function of x dimension (in microns) of the waveguide showing a mode profile at a wavelength of about 3.8 μm according to various embodiments.

FIG. 4A is a plot 400a of y dimension (in microns) as a function of x dimension (in microns) of a waveguide showing a mode profile at a wavelength of about 2 µm according to various embodiments. FIG. 4B is a plot 400b of y dimension (in microns) as a function of x dimension (in microns) of the waveguide showing a mode profile at a wavelength of about 3.8 µm according to various embodiments. The width of the waveguide is about 2 µm and the height of the waveguide is about 1 µm. FIGS. 4A-B show that only single mode is allowed at both the 2 µm wavelength and the 3.8 µm wavelength when the height is about 1 µm and the width is about 2 µm.

Figure 5A:
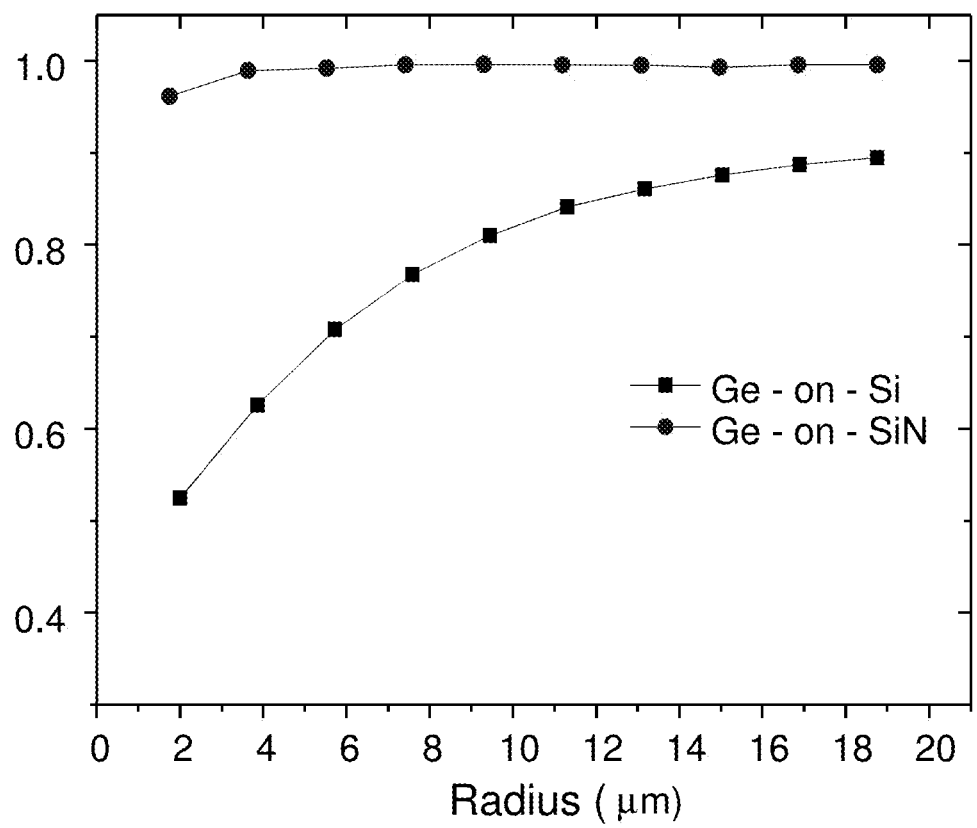
FIG. 5A is a plot of transmission as a function of radius (micrometers or μm) showing the simulation result of bend losses for the optical structure shown in FIG. 3A according to various embodiments and the optical structure shown in FIG. 3B.

The simulated outputs of bent waveguides 304, 354 are compared to determine confinement of optical light in waveguides 304, 354. FIG. 5A is a plot 500a of transmission as a function of radius (micrometers or µm) showing the simulation result of bend losses for the optical structure shown in FIG. 3A according to various embodiments and the optical structure shown in FIG. 3B. The transmission of light may vary from 0 to 1, with 0 representing zero transmission and 1 representing perfect transmission.

The amplitude of the input power of the light is set to 1, and the y-axis shows the transmission at the output end of the waveguides representing the output power of the light. The x-axis shows the variation of the inner radius of the bend from about 2 µm to about 20 µm. As shown from FIG. 5A, the transmission shown by the Ge-on-SiN structure 300 is higher than that of the Ge-on-Si structure 350, which means that the bend loss of Ge-on-SiN structure 300 is smaller than that of Ge-on-Si structure 350. The lowest bend loss of Ge-on-SiN structure 300 is about 0.03 dB/bend while the lowest bend loss of Ge-on-Si structure 350 is about 0.96 dB/bend. The performance of Ge-on-SiN structure 300 is about 96.875% better than Ge-on-Si structure 350, thus demonstrating the efficiency of the Ge-on-SiN structure 300.

Figure 5B:
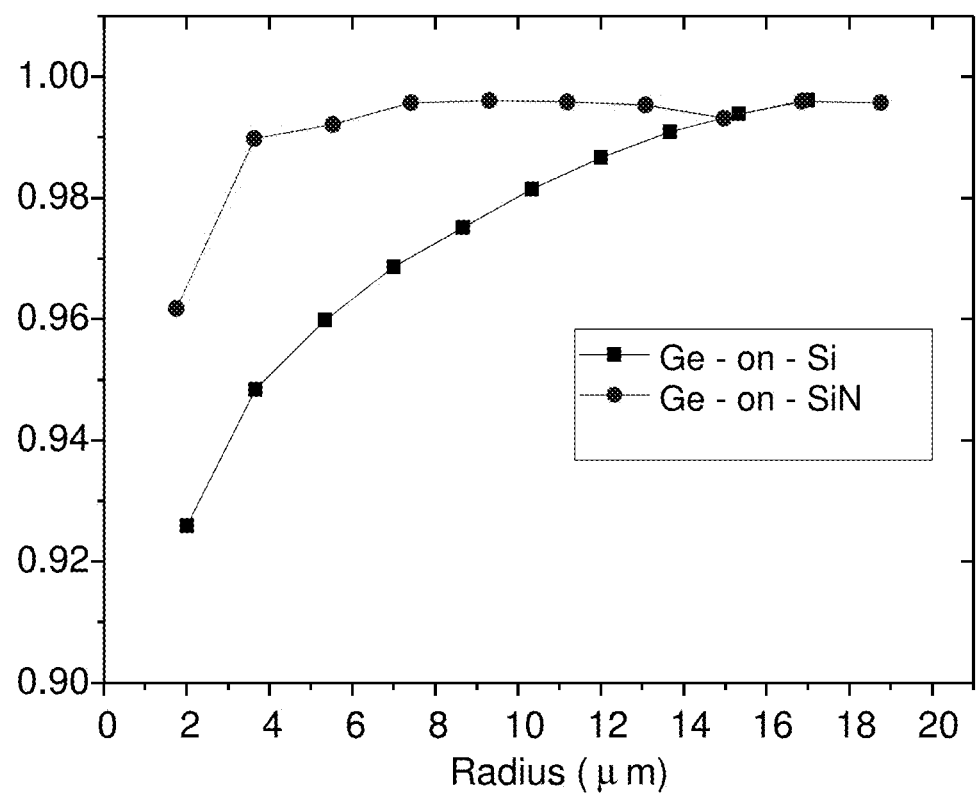
FIG. 5B is a plot of transmission as a function of radius (micrometers or μm) showing the simulation result of bend losses for the optical structure shown in FIG. 3A according to various embodiments and the optical structure shown in FIG. 3B with a width of the waveguide changed to 3 μm.

As the higher bend loss of the Ge-on-Si structure 350 may be caused by the small dimension of the waveguide 354, a further simulation is carried out wherein the dimension of the waveguide 354 is increased without activating the second mode. The width of the waveguide 354 of the Ge-on-Si structure 350 is set to be about 3 µm and the height remains at about 2 µm. The dimensions of the Ge-on-SiN structure 300 used in the second simulation is the same as that used in the first simulation. FIG. 5B is a plot 500b of transmission as a function of radius (micrometers or µm) showing the simulation result of bend losses for the optical structure shown in FIG. 3A according to various embodiments and the optical structure shown in FIG. 3B with a width of the waveguide changed to 3 µm.

According to the results of the second simulation, it is seen that the Ge-on-SiN reaches a very low loss at a bending radius of about 3 µm, while the loss of the Ge-on-Si becomes comparable to the loss of Ge-on-SiN only at the bending radius of about 16 µm or greater. Even though the dimensions of the Ge-on-Si waveguide 354 are changed to reduce the bend loss so that the loss of the Ge-on-Si structure 350 is comparable to that of the Ge-on-SiN structure 300, the radii of the bends that are able to provide the lowest loss for the two structures are different. Henceforth, the Ge-on-SiN structure 300 can provide a low loss at a much smaller bend, thus making the smaller and dense integration possible. Therefore, these two simulations show that the new structure that has not been reported before can realize denser integration with low loss.

Figure 6:
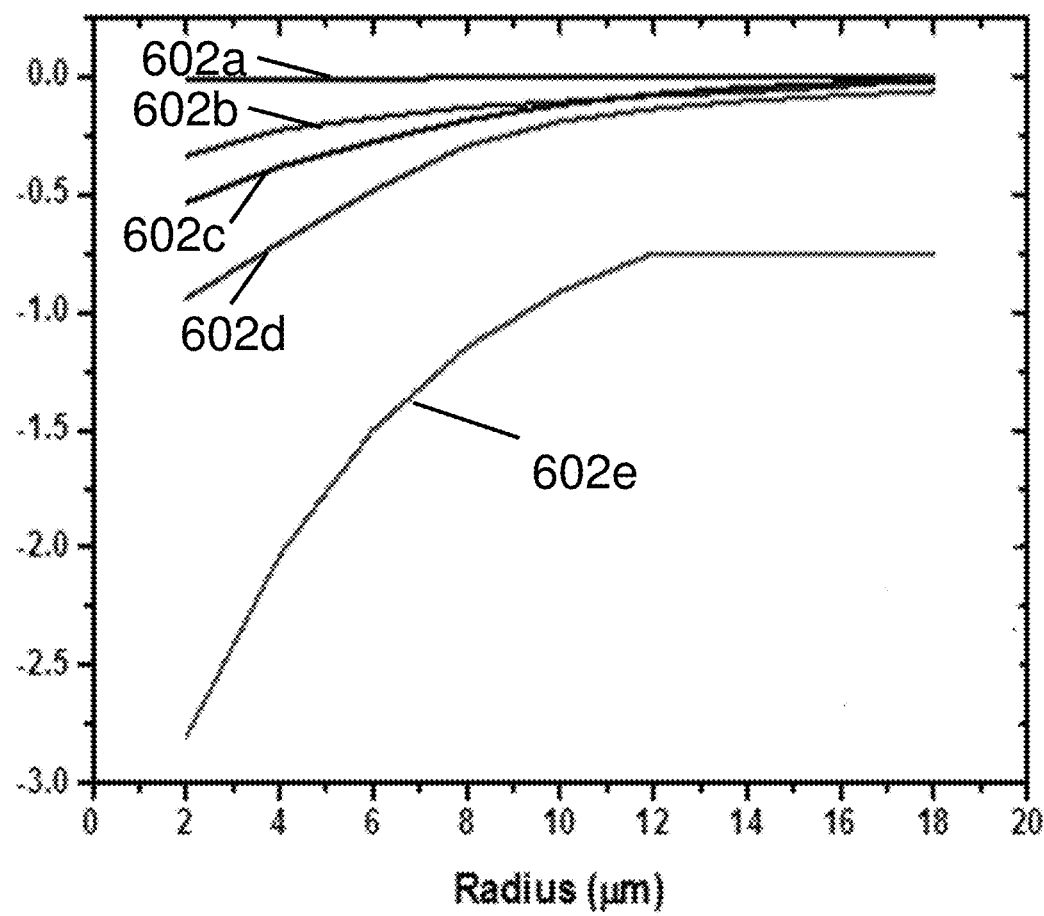
FIG. 6 is a plot of bend loss (decibels/bend or dB/bend) as a function of radius (micrometers or μm) showing the simulation result of bend losses for a germanium-on-silicon nitride (GON) optical structure according to various embodiments and for different germanium-on-silicon (GOS) optical structures.

FIG. 6 is a plot 600 of bend loss (decibels/bend or dB/bend) as a function of radius (micrometers or µm) showing the simulation result of bend losses for a germanium-on-silicon nitride (GON) optical structure according to various embodiments and for different germanium-on-silicon (GOS) optical structures.

602a represents data for a GON optical structure with a waveguide of width of 2 µm and height of 1 µm; 602b represents data for a GOS optical structure with a waveguide of width of 3 µm and height of 2 µm; 602c represents data for a GOS optical structure with a waveguide of width of 2.5 µm and height of 1.5 µm; 602d represents data for a GOS optical structure with a waveguide of width of 2.2 µm and height of 1.2 µm; and 602e represents data for a GOS optical structure with a waveguide of width of 2 µm and height of 1 µm.

In FIG. 6, the cross-sectional dimensions of the waveguides on GOS are varied and bend losses of these GOS structures are compared with the bend loss of the GON structure. When the waveguides on GON and GOS have the same cross-sectional dimension (2 µm×1 µm), the bend losses are significantly different. Specifically, when the bending radius is 5 µm, GON has a loss of 0.03 dB/bend while GOS has a loss of 1.49 dB/bend. Since the waveguide with a larger cross-sectional dimension has a better mode confinement, the bend loss should be smaller. As can be seen from FIG. 6, the bend loss of the waveguides on GOS significantly decreases as the cross-sectional dimensions increase. However, the smallest bend loss of waveguides on GOS is still larger than that of GON. The simulation result shows that GON can allow low loss with a small radius of bend of the waveguide, and a compact cross-sectional dimension may be achieved due to the low loss even when dimensions of the waveguide are small. The low loss of the GON structure may be attributable to the large refractive index contrast between the core layer and the cladding layer.

The GON and GOS optical structures have also been fabricated.

Germanium on Insulator (GOI) structures may be fabricated by several techniques. For instance, GOI structures may be formed by Ge condensation, layer transfer, and/or and liquid phase epitaxy. The Ge condensation technique may involve the thermal oxidation of an epitaxially grown, strained SiGe layer on silicon on insulator (SOI). The thermal oxidation carried out in $O_2$ atmosphere may result in the rejection of Ge atoms from the $SiO_2$ layers, The top oxide layer and the buried oxide layer may limit the outward diffusion of the Ge atoms. Further, oxidation of the SiGe on insulator layers may result in complete condensation of Ge, thus forming a thin GOI layer. The Ge layer may be of a single crystal structure with the same orientation as the silicon in the SOI substrate.

Liquid phase epitaxy (LPE) may be a method compatible with silicon based fabrication. A rapid thermal annealing (RTA) system may be utilized with the help of self aligned microcrubicles to contain the Ge liquid from flowing randomly. LPE may occur during the cooling process resulting in high quality single crystal structures. However, when Ge is grown directly on SiN, a number of defects may form at the interface and this may increase the propagation loss.

Various embodiments may relate to a method of wafer bonding and layer transfer to fabricate Ge on SiN, which may provide for ease in scalability. In addition, the wafer bonding and layer transfer technique may form a Ge layer with low surface roughness, tensile strain, as well as low threading dislocations density level.

Figure 7A:
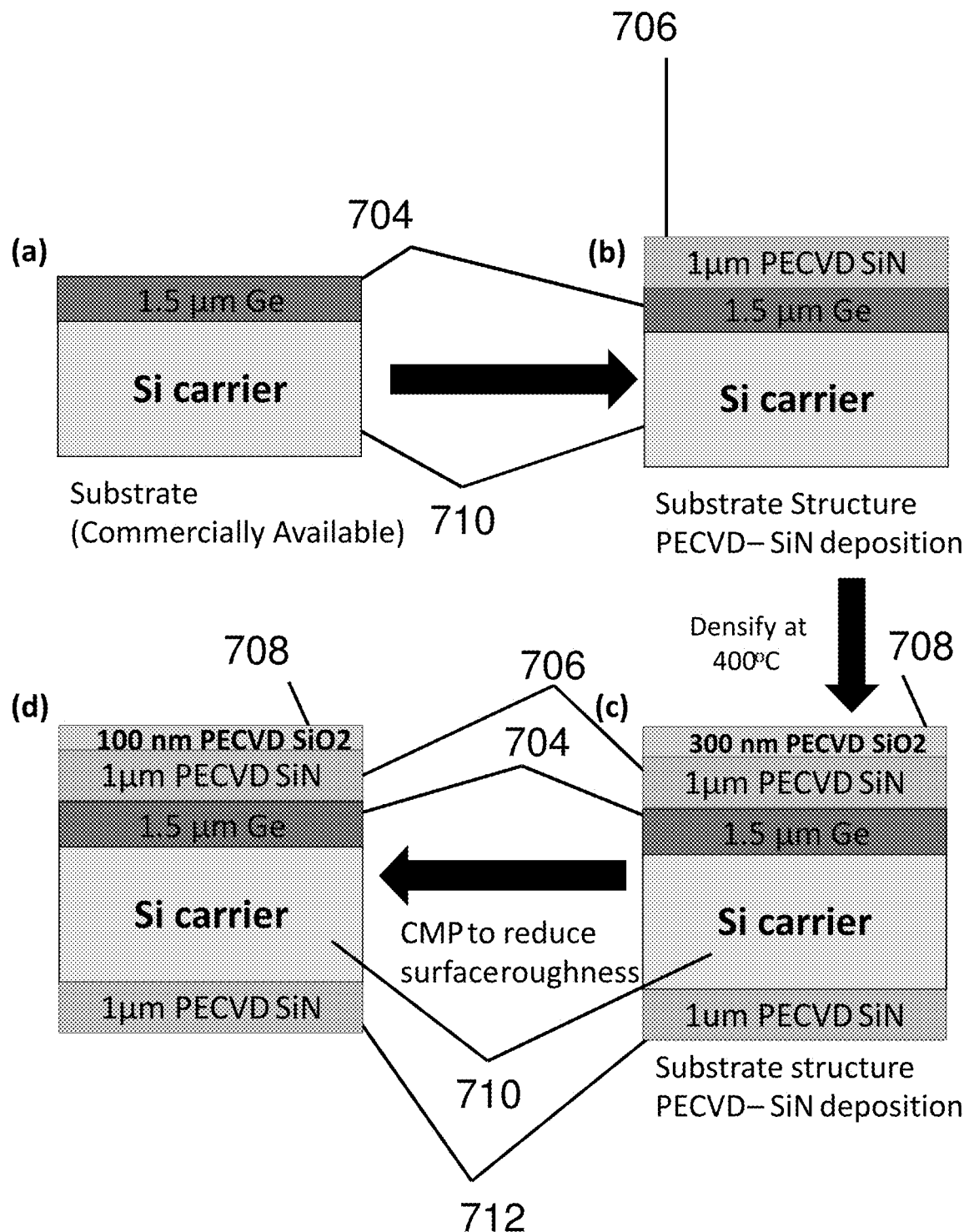
FIG. 7A shows a method of forming a stacked arrangement according to various embodiments.

FIG. 7A shows a method of forming a stacked arrangement according to various embodiments. The stacked arrangement may include the carrier 710, the core layer 704, the intermediate layer 706, the further layer 712, and the buffer layer 708.

Commercially available Ge (about 1.5 μm) grown on Si wafers (Dia—about 150 mm, p-type), i.e. germanium layer 704 on a silicon carrier 710, may be utilized for the plasma enhanced chemical vapor deposition (PECVD) deposition of SiN so that a SiN intermediate layer 706 is formed on the germanium layer 704. A buffered oxide etch (BOE—mixture of $NH_4F+HF$) cleaning of the wafers may be carried out to obtain a surface free of oxide and contaminants, followed by a deionized (DI) water rinse and $N_2$ drying before deposition of the SiN.

The growth of about 1 μm thick SiN is illustrated in FIG. 7A. The clean wafer (Ge layer 704 on Si carrier 710) may be loaded into a Cello plasma enhanced chemical vapour deposition (PECVD system) for the deposition of tensile strained SiN (about 1 μm) at about 300° C. to form layer 706. A post deposition anneal at about 400° C. may be carried out for several hours to ensure the release of gases trapped during deposition. Further, another about 1 μm of SiN may be deposited on the backside of the Si carrier 710 to form a further SiN layer 712 to compensate for the bowing effect, followed by a similar post anneal process. The deposition of about 300 nm of $SiO_2$ may then be carried out via low temperature PECVD to form a $SiO_2$ buffer layer 708 on the SiN layer 706. The buffer layer 708 may act as a bonding layer for ease of subsequent bonding with a Si handle wafer or substrate. The stacked arrangement may be subjected to chemical mechanical polishing (CMP) so that the buffer layer 708 may be reduced to about 100 nm of $SiO_2$ to reduce the surface roughness of the buffer layer 708 for wafer bonding.

Figure 7B:
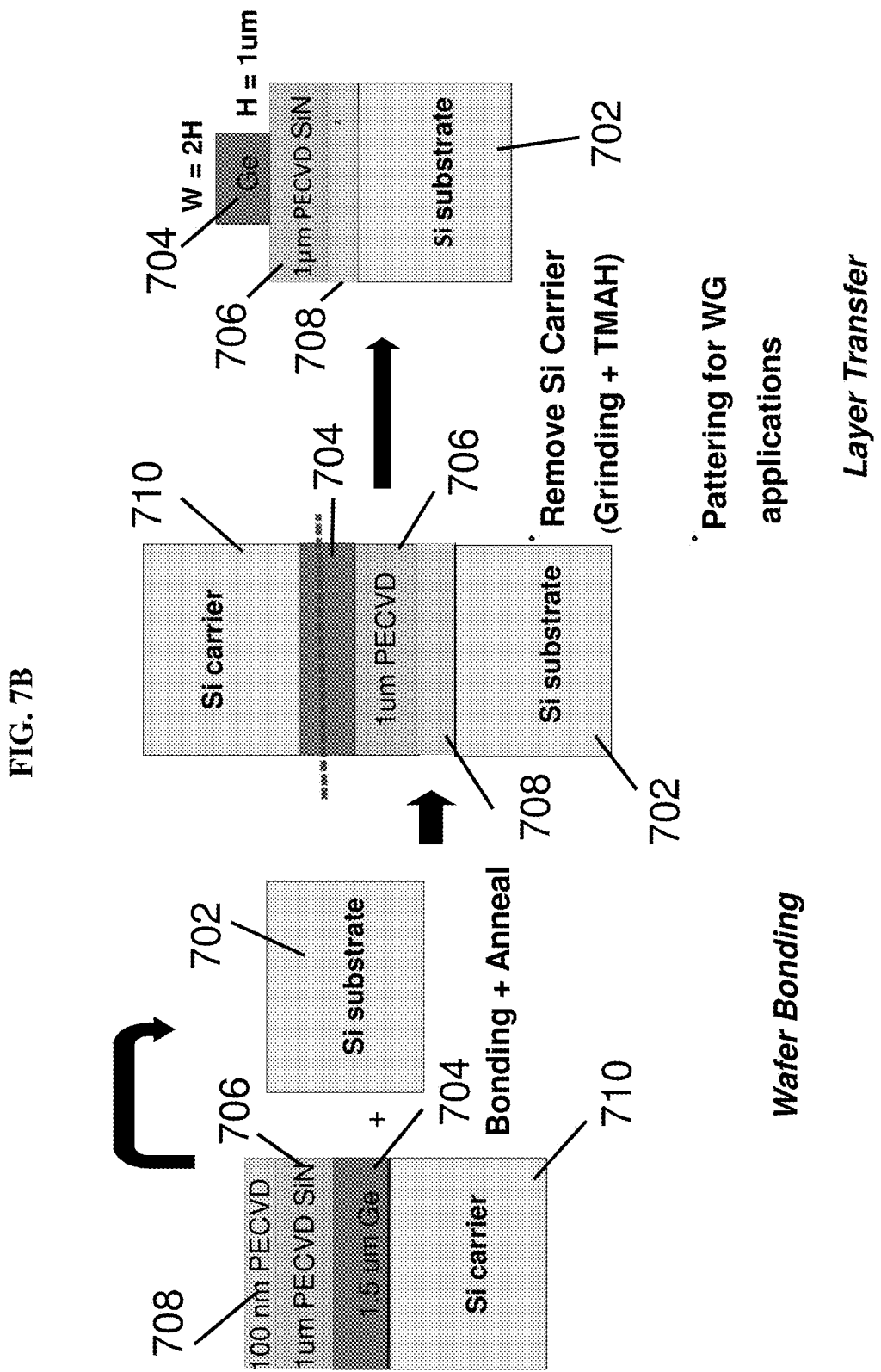
FIG. 7B shows a method of forming an optical structure via a wafer bonding and layer transfer methodology according to various embodiments.

The stacked arrangement may be further bonded onto a silicon (Si) substrate 702. FIG. 7B shows a method of forming an optical structure via a wafer bonding and layer transfer methodology according to various embodiments. Prior to bonding, both the wafer surfaces may be exposed to $O_2$ plasma for about 15 s to improve the hydrophilicity of the surfaces. In other words, the surface of the buffer layer 708 and the substrate 702 may be exposed to plasma. Further, a deionized (DI) water rinsing step may be carried out to improve the density of the surface hydroxyl group to initiate bonding. The bonded wafers may be further be subjected to post-bond annealing at about 300° C. for about 4 hours to improve the bonding strength. The bonded wafers may be inspected using infrared (IR) imaging to check for the formation of interfacial voids. Further, the silicon carrier 710 and the further layer 712 (not shown in FIG. 7B) may be removed. The silicon carrier 710 may subjected to mechanical grinding, followed by wet etching using tetramethylammonium hydroxide (TMAH) to completely remove the silicon carrier 710, thereby completing the transfer process. Given the high selectivity of TMAH for Ge over Si, a smooth clean interface of the exposed surface Ge layer 704, i.e. the surface of the Ge layer opposite the surface interfacing with the SiN layer 706 may be obtained. The Ge layer 704 may be patterned using electron beam (e-beam) lithography and/or optical lithography to form the core layer 704.

The optical structure including the core layer 704 on the intermediate SiN layer 706 may have numerous applications, such as mid-IR based sensing, or photonic applications which require a more compact design. The method illustrated in FIGS. 7A-B may have advantages, such as forming a core layer that has low surface roughness, tensile strain, as well as low threading dislocations density level.

Figure 8A:
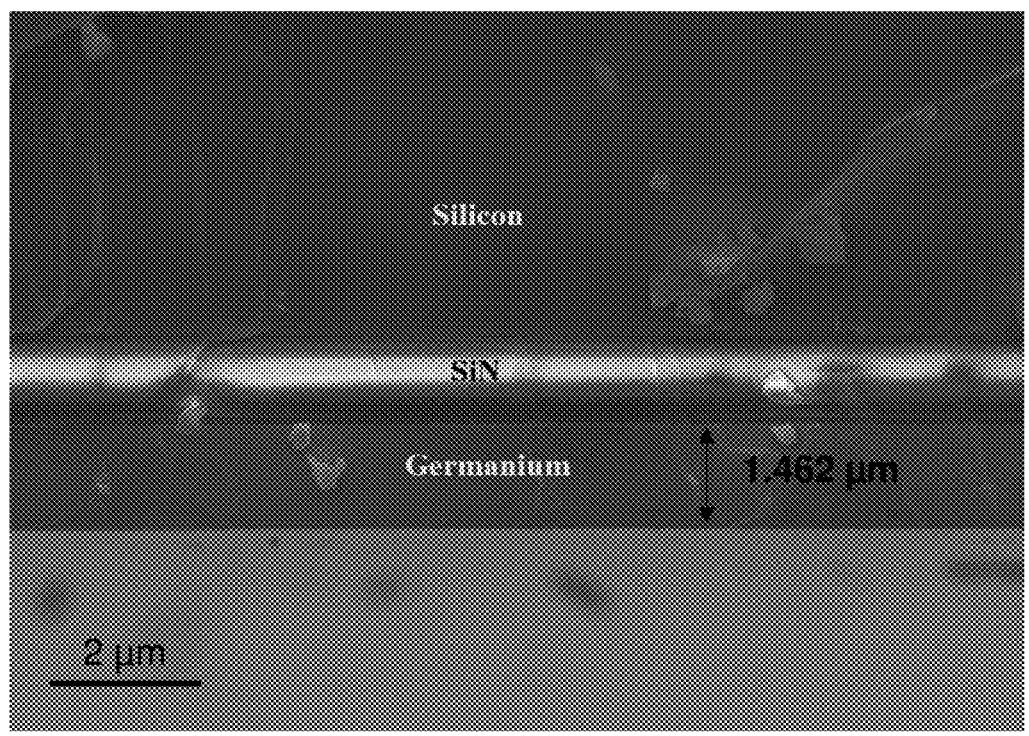
FIG. 8A is a first cross-sectional scanning electron microscopy (SEM) image of a germanium-on-silicon nitride (Ge-on-SiN or GON) structure formed by the layer transfer method according to various embodiments.
Figure 8B:
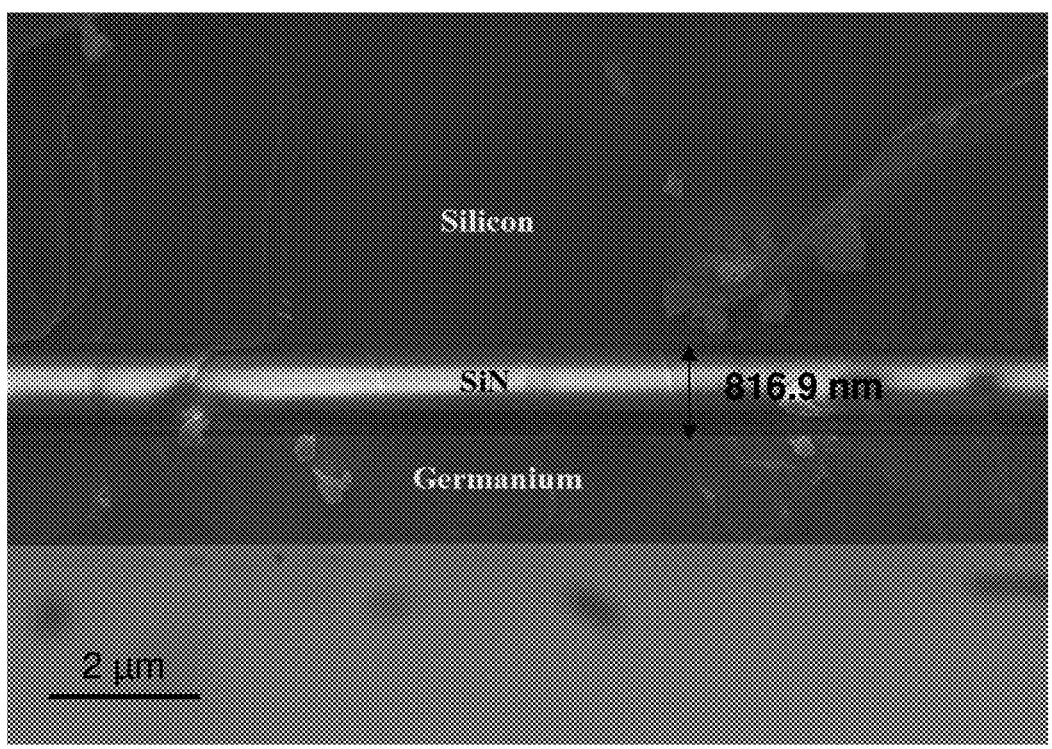
FIG. 8B is a second cross-sectional scanning electron microscopy (SEM) image of a germanium-on-silicon nitride (Ge-on-SiN or GON) structure formed by the layer transfer method according to various embodiments.

FIG. 8A is a first cross-sectional scanning electron microscopy (SEM) image of a germanium-on-silicon nitride (Ge-on-SiN or GON) structure formed by the layer transfer method according to various embodiments. FIG. 8B is a second cross-sectional scanning electron microscopy (SEM) image of a germanium-on-silicon nitride (Ge-on-SiN or GON) structure formed by the layer transfer method according to various embodiments. The Ge layer has a thickness of about 1.462 μm, and the SiN layer has a thickness of about 816.9 nm.

Figure 9A:
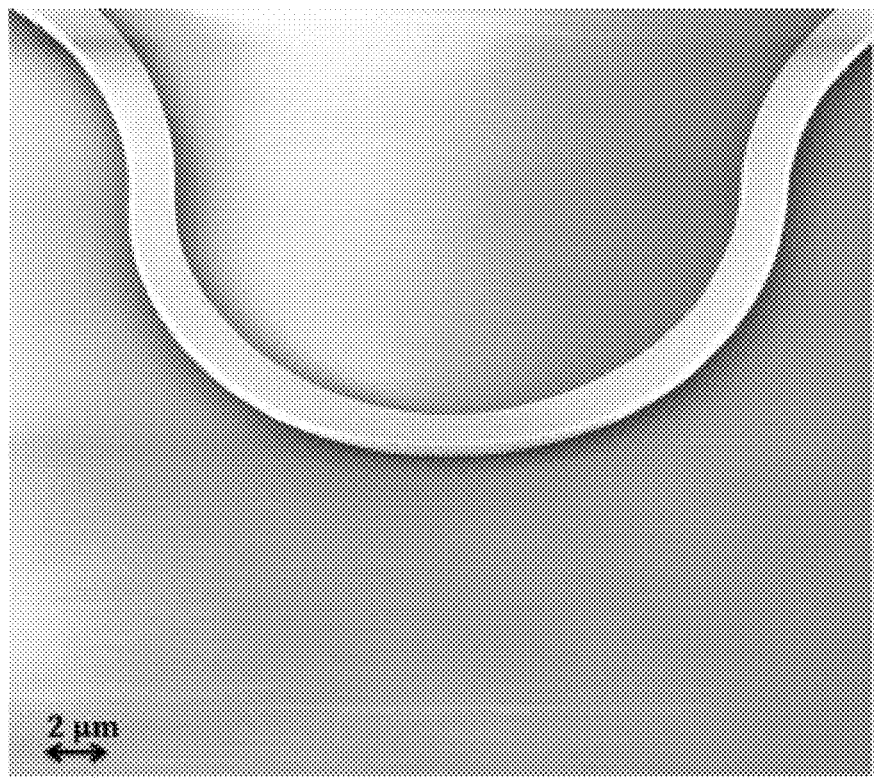
FIG. 9A is a scanning electron microscopy (SEM) of a bent portion of a waveguide formed according to various embodiments.
Figure 9B:
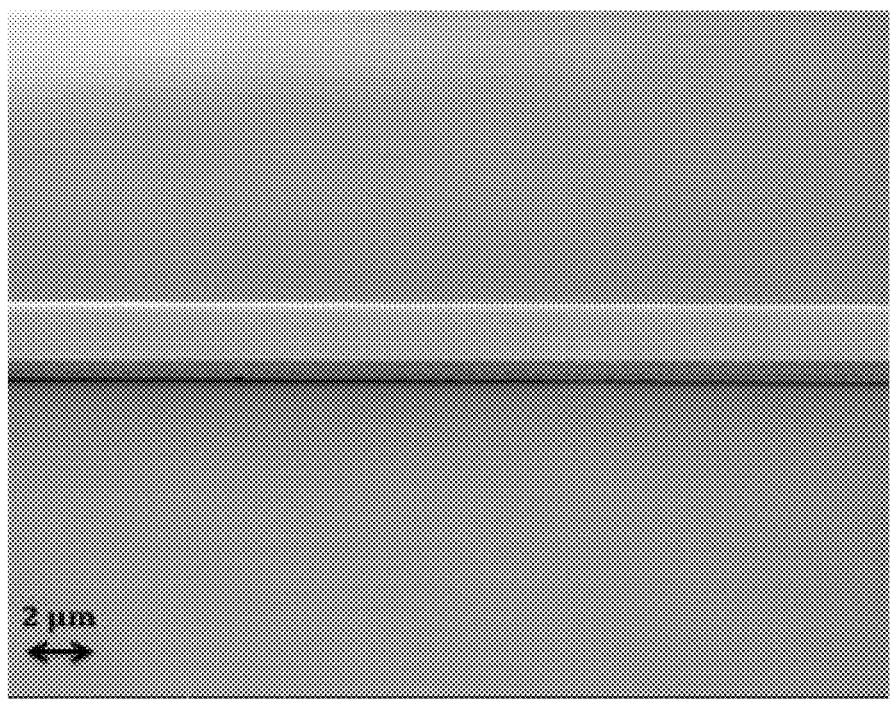
FIG. 9B is a scanning electron microscopy (SEM) of a straight waveguide formed according to various embodiments.
Figure 9C:
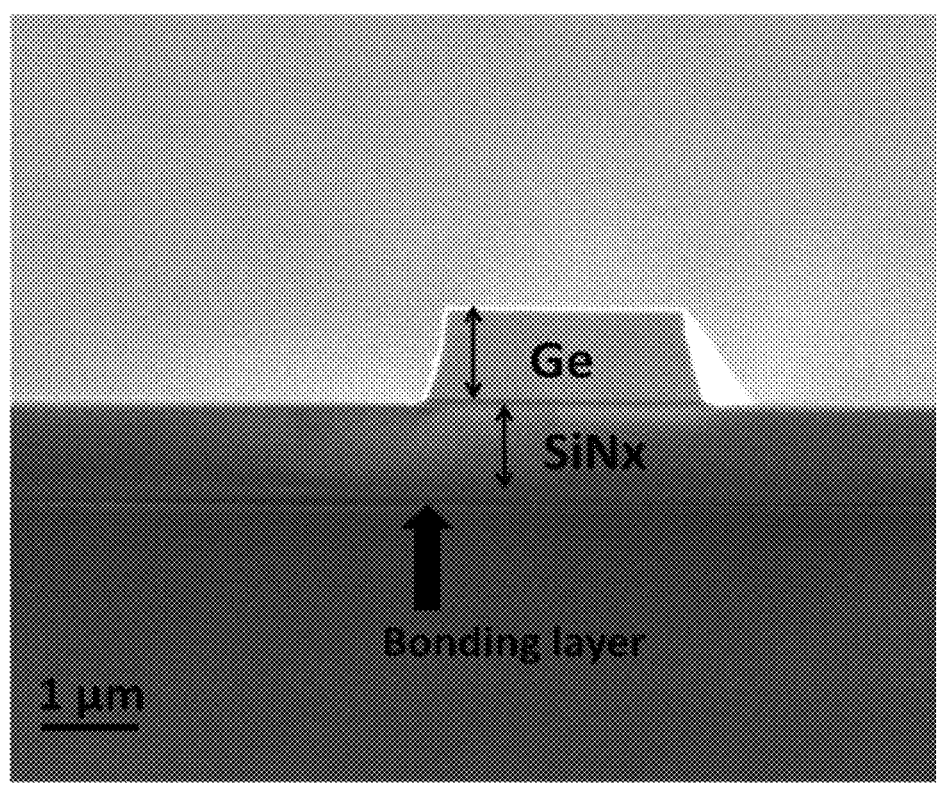
FIG. 9C is a cross-sectional scanning electron microscopy (SEM) image of a fabricated strip waveguide according to various embodiments.

FIG. 9A is a scanning electron microscopy (SEM) of a bent portion of a waveguide formed according to various embodiments. FIG. 9B is a scanning electron microscopy (SEM) of a straight waveguide formed according to various embodiments. FIG. 9C is a cross-sectional scanning electron microscopy (SEM) image of a fabricated strip waveguide according to various embodiments.

Figure 10A:
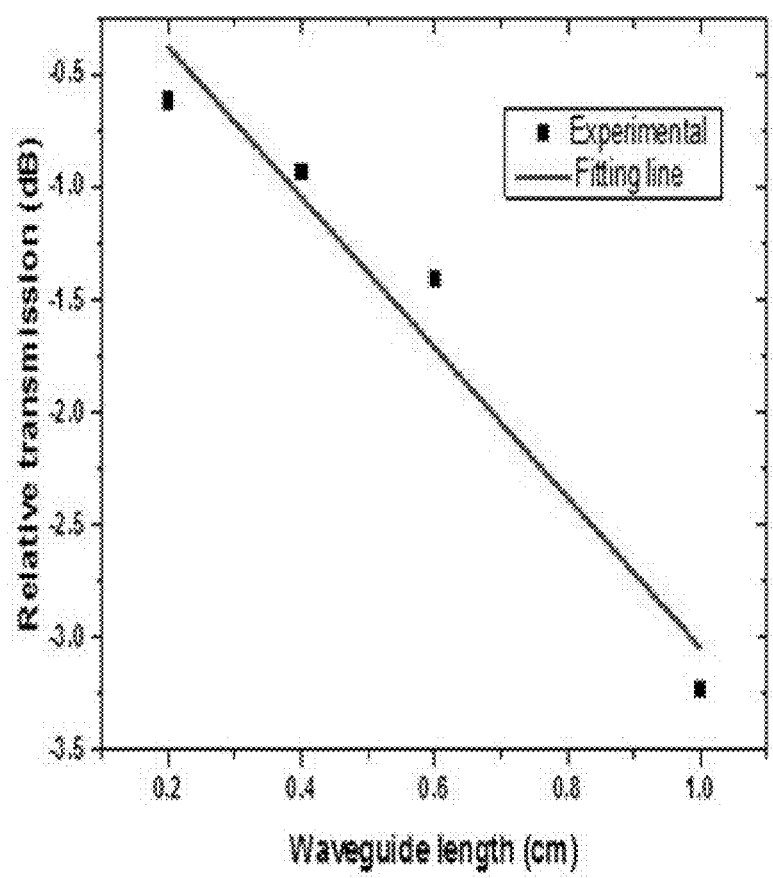
FIG. 10A is a plot of radiative transmission (decibels or dB) as a function of waveguide length (centimeter or cm) of a germanium-on-nitride (GON) based waveguide according to various embodiments.
Figure 10B:
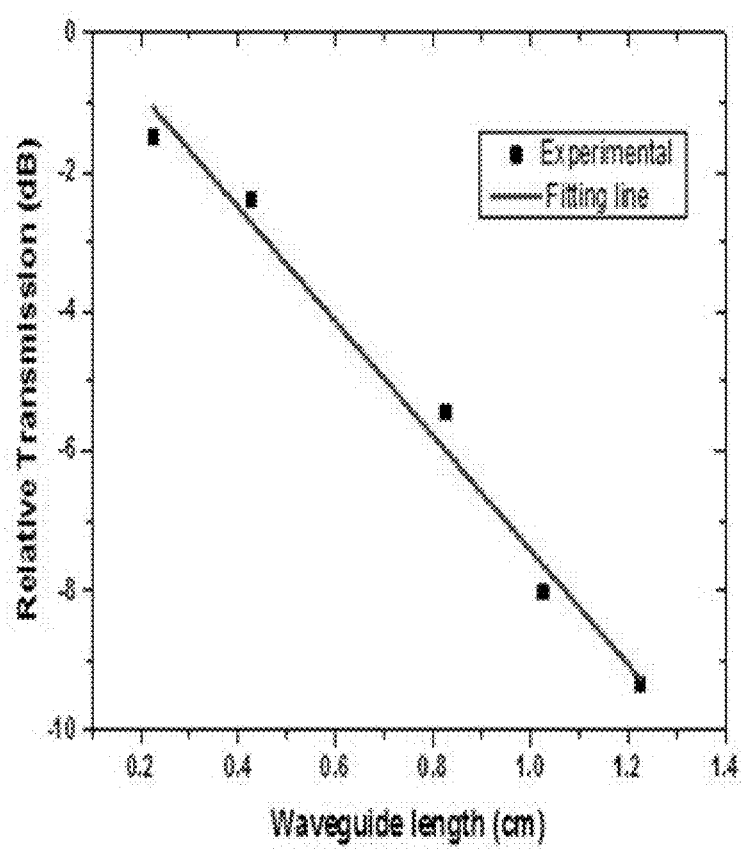
FIG. 10B is a plot of radiative transmission (decibels or dB) as a function of waveguide length (centimeter or cm) of a germanium-on-silicon (GOS) based waveguide.

The propagation loss and bend loss of the fabricated waveguides are measured and compared with the waveguides fabricated on a germanium-on-silicon (GOS) wafer with the same size and similar fabrication processes. FIG. 10A is a plot 1000a of radiative transmission (decibels or dB) as a function of waveguide length (centimeter or cm) of a germanium-on-nitride (GON) based waveguide according to various embodiments. FIG. 10B is a plot 1000b of radiative transmission (decibels or dB) as a function of waveguide length (centimeter or cm) of a germanium-on-silicon (GOS) based waveguide. The GON-based waveguide has a propagation loss of 3.35±0.5 dB/cm as shown in FIG. 10A, while the GOS-based waveguide has a propagation loss of 8.18±0.6 dB/cm.

As can be seen from the measurement results, the propagation loss of waveguides on GOS is much larger than that of waveguides on GON. This may be because the poor mode confinement of GOS makes the light interact with the sidewalls and Ge/Si interface intensively causing a large scattering loss. However, GON may have a smaller propagation loss due to its large core-clad index contrast, resulting in a better mode confinement. The misfit dislocation at the Ge/Si interface may be actually one of the major sources of the propagation loss. Due to the large lattice mismatch (4%) between Ge and Si, there may be misfit dislocations formed at the Ge/Si interface when Ge is deposited onto a Si wafer. However, these misfit dislocations may be removed during GON wafer fabrication process according to various embodiments by chemical mechanical polishing. Thus the GON platform may not only provide a high core-clad index contrast, but also a low propagation loss which is very critical in photonic applications.

Furthermore, the bend losses of fabricated waveguides based on GON and GOS were also measured.

Figure 11A:
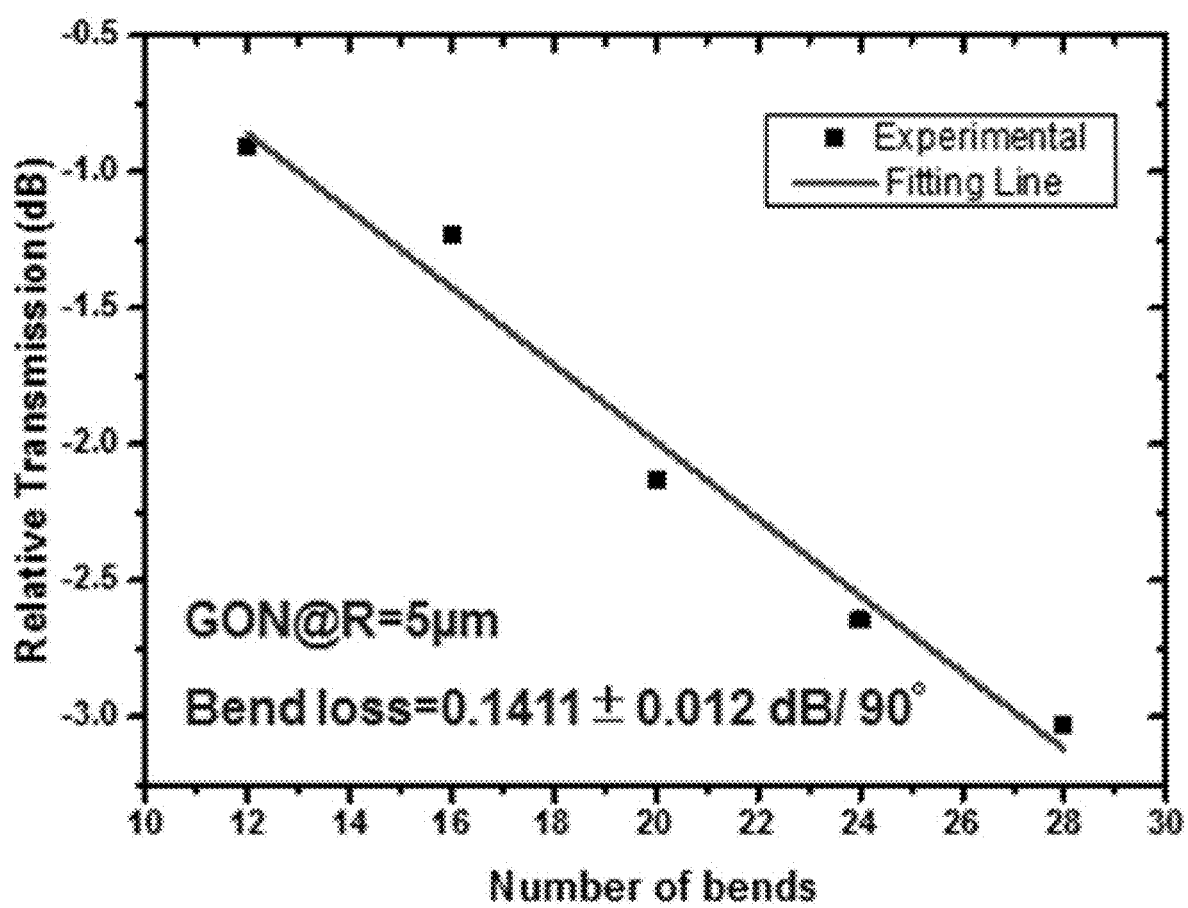
FIG. 11A is a plot of radiative transmission (decibels or dB) as a function of the number of bends of a germanium-on-nitride (GON) based waveguide with a bending radius (R) of 5 μm according to various embodiments.
Figure 11B:
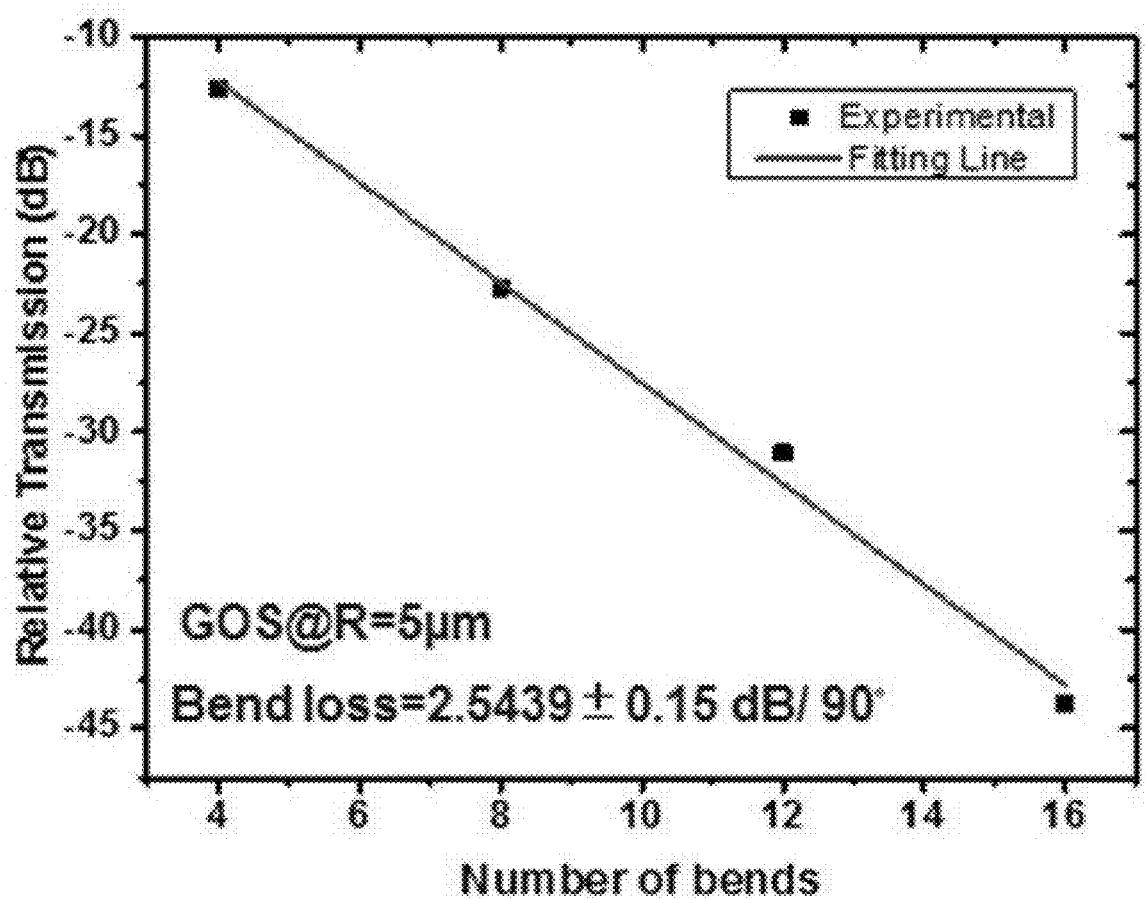
FIG. 11B is a plot of radiative transmission (decibels or dB) as a function of the number of bends of a germanium-on-silicon (GOS) based waveguide with a bending radius (R) of 5 μm.
Figure 11C:
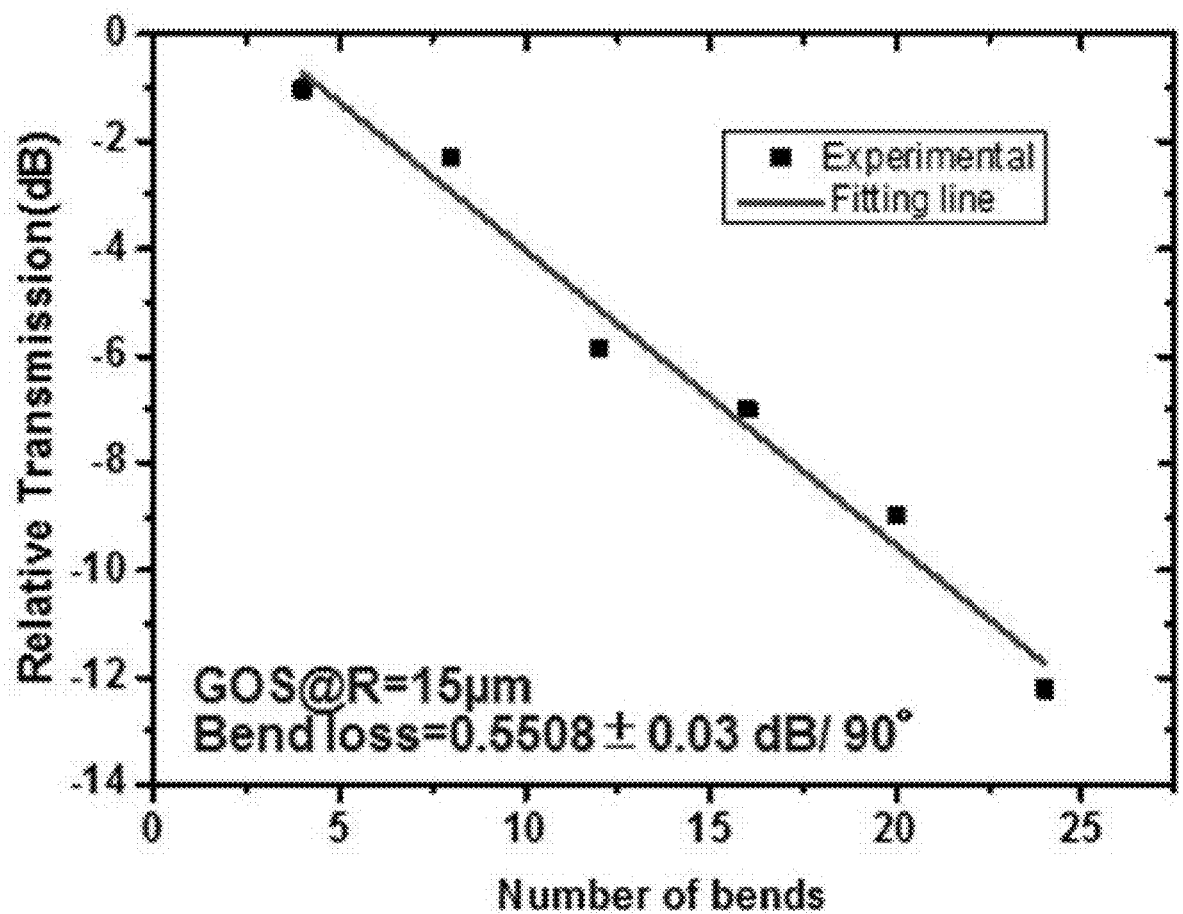
FIG. 11C is a plot of radiative transmission (decibels or dB) as a function of the number of bends of a germanium-on-silicon (GOS) based waveguide with a bending radius (R) of 15 μm.
Figure 11D:
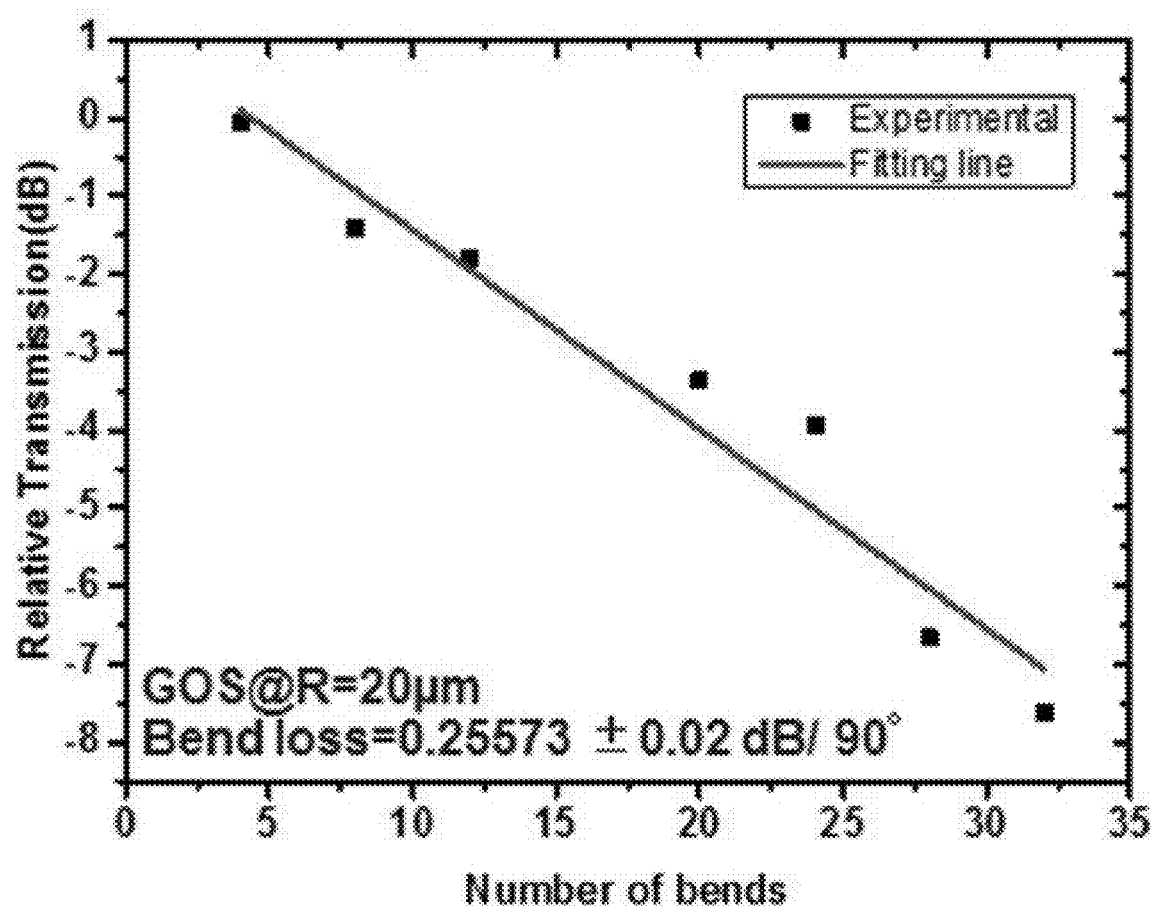
FIG. 11D is a plot of radiative transmission (decibels or dB) as a function of the number of bends of a germanium-on-silicon (GOS) based waveguide with a bending radius (R) of 20 μm.

FIG. 11A is a plot 1100a of radiative transmission (decibels or dB) as a function of the number of bends of a germanium-on-nitride (GON) based waveguide with a bending radius (R) of 5 μm according to various embodiments. FIG. 11B is a plot 1100b of radiative transmission (decibels or dB) as a function of the number of bends of a germanium-on-silicon (GOS) based waveguide with a bending radius (R) of 5 μm. FIG. 11C is a plot 1100c of radiative transmission (decibels or dB) as a function of the number of bends of a germanium-on-silicon (GOS) based waveguide with a bending radius (R) of 15 μm. FIG. 11D is a plot 1100d of radiative transmission (decibels or dB) as a function of the number of bends of a germanium-on-silicon (GOS) based waveguide with a bending radius (R) of 20 μm.

The fabricated waveguides on both GON and GOS wafers have the same cross-sectional dimension. From the measurement results, it can be observed that the waveguide based on GON only has a bend loss of about 0.14 dB/bend at a bending radius of only 5 μm (FIG. 11A), while the bend loss of the waveguide based on GOS at the same bending radius is much higher, at about 2.5 dB/bend (FIG. 11B). As the bending radius increases, the bend loss of waveguides based on GOS decreases, but the bend loss is still larger than that of waveguides on GON, even at a radius of 20 μm. The bent waveguides based on GON with a bending radius of 5 μm outperform the waveguides based on GOS with a bending radius of 20 μm. This clearly demonstrates that the GON platform according to various embodiments may allow significant reduction in the size of bent waveguides, thus allowing compact footprint of on-chip devices which are essential for miniaturization and improved response sensitivity, especially under circumstances when a large amount of analyte is not available.

The characterization results show the feasibility of the GON platform (which is scalable to any wafer size) and waveguide structures are demonstrated successfully. The measurement data (propagation loss and bend loss) convincingly supported the hypothesis that GON-based waveguides have advantages over GOS-based waveguides. In various embodiments, the GON structure may be used for chemical sensing.

The structure according to various embodiments may be extended to other material systems materials. Similar improvements in properties may be expected with a wider range of applications. For instance, GeSn may be used as a material in the core layer due to its wide ranging optical transparency in the mid-IR region with minimal or reduced loss. Therefore, utilizing GeSn may be highly advantageous, and the structure of GeSn-on-Si or GeSn-on-Ge may be realized with ease for active devices such as photodetectors which may have practical applications in the mid-IR wavelength regime.

Furthermore, the intermediate layer may include other dielectric materials and/or III-V thin film materials. Lumerical FDTD simulation shows that these dielectric materials and/or III-V materials may provide a compact waveguide design. The intermediate layer including these materials may provide a high refractive index contrast when the core layer includes germanium.

FIG. 12 is a table 1200 showing several materials which may be used in the optical structure according to various embodiments. $Al_2O_3$ and AlN are two alternate dielectric materials which may be used. Simulation studies have been carried out for these two materials. These two materials may not only provide lower refractive index but also have excellent thermal conductivity & stability with good dielectric properties. In the simulated structure, the layer thickness and the waveguide dimensions have been maintained to be the same as earlier. A single mode transmission in these structures was also verified. The inner radius of the bend is varied from about 2 μm to about 18 μm and the transmission at the output end is recorded.

Figure 13:
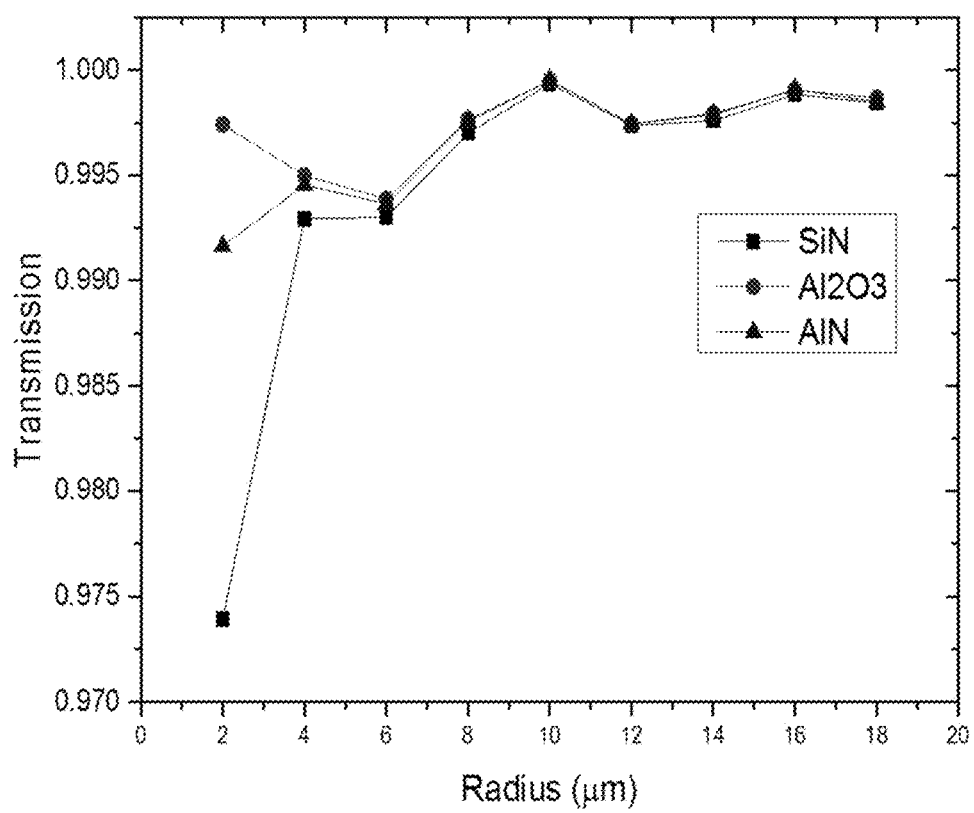
FIG. 13 is a plot of transmission as a function of bending radius (in micrometers or μm) showing the change in bend losses as the bending radius changes in germanium-on-silicon nitride (SiN) based waveguide, germanium-on-aluminum oxide ($Al_2O_3$) based waveguide, and germanium-on-aluminum nitride (AlN) based waveguide according to various embodiments.

FIG. 13 is a plot 1300 of transmission as a function of bending radius (in micrometers or μm) showing the change in bend losses as the bending radius changes in germanium-on-silicon nitride (SiN) based waveguide, germanium-on-aluminum oxide ($Al_2O_3$) based waveguide, and germanium-on-aluminum nitride (AlN) based waveguide according to various embodiments. FIG. 13 shows the change in transmission with increasing radius of the bending when SiN, AlN or $Al_2O_3$ are used as the intermediate layer. Both AlN and $Al_2O_3$ show highly similar characteristics to that of SiN, with a more than 97% performance improvement compared to Ge-on-Si structure. Although these two materials may serve as good replacements for SiN, it is to be noted that the optical transparency of SiN in the mid IR region is much wider (up to ~7 μm). In addition, SiN may have unique performance and processing advantages for passive mid-IR photonics.

Figure 14:
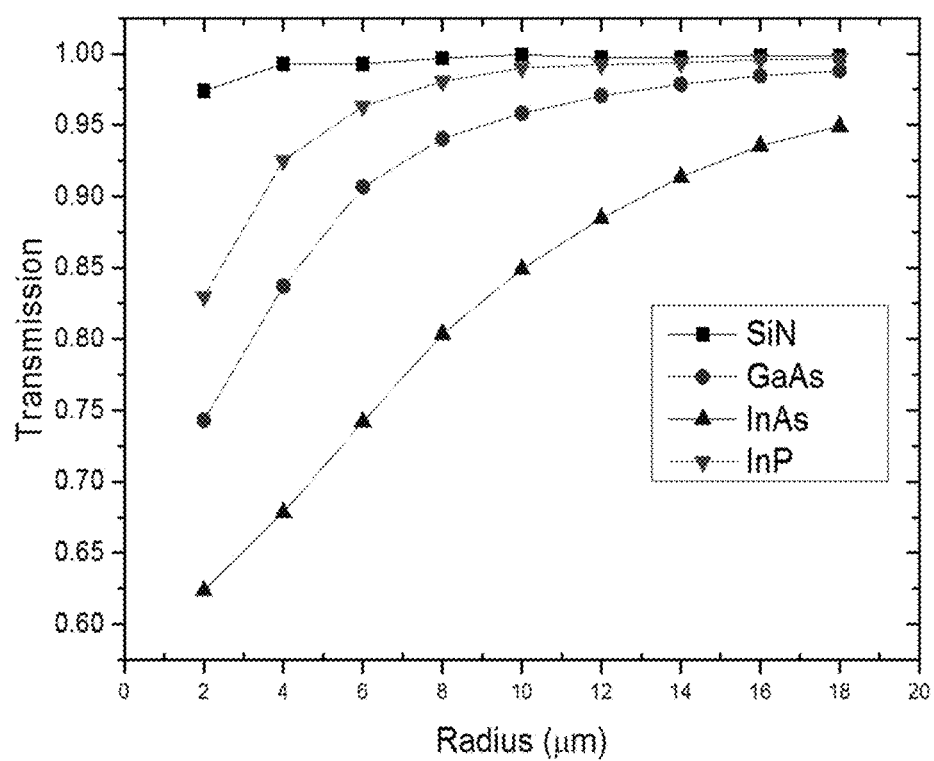
FIG. 14 is a plot of transmission as a function of bending radius (in micrometers or μm) showing the change in bend losses as the bending radius changes in germanium-on-silicon nitride (SiN) based waveguide, germanium-on-indium phosphide (InP) based waveguide, germanium-on-gallium arsenide (GaAs) based waveguide, and germanium-on-indium arsenide (InAs) based waveguide according to various embodiments.

III-V films may also be used as alternatives to SiN. FIG. 14 is a plot 1400 of transmission as a function of bending radius (in micrometers or μm) showing the change in bend losses as the bending radius changes in germanium-on-silicon nitride (SiN) based waveguide, germanium-on-indium phosphide (InP) based waveguide, germanium-on-gallium arsenide (GaAs) based waveguide, and germanium-on-indium arsenide (InAs) based waveguide according to various embodiments. Although the performance of SiN may be the most efficient as shown in FIG. 14, III-V materials may provide for a more compact design as compared to Ge-on-Si structure.

Figure 15:
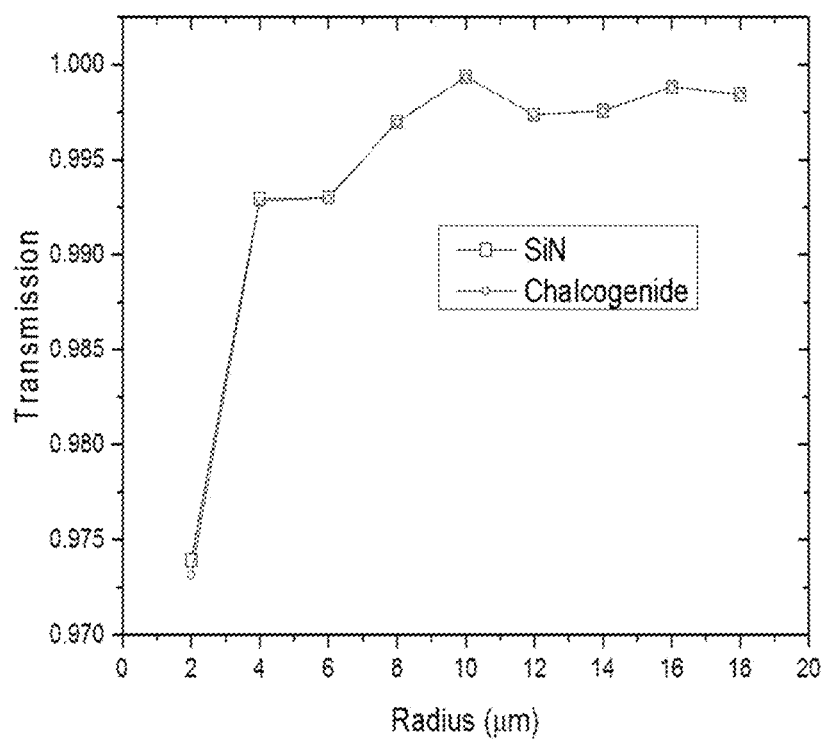
FIG. 15 is a plot of transmission as a function of bending radius (in micrometers or μm) showing the change in bend losses as the bending radius changes in germanium-on-silicon nitride (SiN) based waveguide, and germanium-on-chalcogenide material based waveguide according to various embodiments.

Chalcogenide materials may also be used as an alternative for SiN. Chalcogenide material may have a refractive index of 2.4120 at about 3.8 μm, nearly the same as of SiN. In addition, chalcogenide material may provide advantages such as a wide transparency window up to about 12 μm, which is much wider as compared to SiN. Therefore, chalcogenide materials may not only enable in developing a compact structure, but may also be put to use for sensing of a variety of different chemical/biological species. FIG. 15 is a plot 1500 of transmission as a function of bending radius (in micrometers or μm) showing the change in bend losses as the bending radius changes in germanium-on-silicon nitride (SiN) based waveguide, and germanium-on-chalcogenide material based waveguide according to various embodiments. FIG. 15 shows that the performance for both the Ge-on-chalcogenide and Ge-on-SiN systems may be comparable, as the curves for Ge-on-chalcogenide and Ge-on-SiN overlap each other.

In various embodiments, the optical structure may be a waveguide structure. The waveguide structure may include a substrate and a core layer. The waveguide structure may further include an intermediate layer or under-cladding layer disposed between the substrate and the core layer. The core layer may include but is not limited to germanium (Ge) and germanium tin (GeSn). The intermediate layer or under-cladding layer may include but is not limited to dielectric materials, III-V materials and chalcogenide materials. Some examples of the dielectric materials may include but are not limited to silicon nitride (SiN), aluminum oxide ($Al_2O_3$) and aluminum nitride (AlN). Some examples of the III-V materials may include but are not limited to indium phosphide (InP), indium arsenide (InAs) and gallium arsenide (GaAs).

Currently, the mid-infrared region (about 3 μm-about 12 μm) of the electromagnetic waves is of particular interest and attracts a lot of attention. It is not only because of the relevance of this region for applications in communications, but also the potential sensing applications since many atmospheric gases and liquids have fingerprint spectra in this wavelength range.

Passive waveguide structures and optical resonators may be developed and be utilized for sensing applications.

Ge on Si platform fits the requirements for a suitable platform for the mid-infrared wavelength range. However, due to the larger refractive index contrast between Ge and SiN as compared with that between Ge and Si, Ge on SiN platform may allow for stronger confinement of optical signal, and/or may lower propagation loss.

Hence, Ge on SiN platform may provide better performances for many of the potential applications, both active and passive devices, such as waveguides, resonators, and optical switches.

The different materials which may be incorporated into the structure geometry as under-cladding layers are performance driven and may enable numerous, specific end user applications.

For example, the material choices of SiN, $Al_2O_3$, AlN, or chalcogenide may enhance the sensitivity as well as the selectivity of the sensor devices. The higher sensitivity may enable the detection of a wider range of biological/chemical molecules from their characteristic absorption fingerprints.

The development of GeSn as the core material may be highly beneficial for active device applications such as photodetectors, modulators and light sources.

The heterostructure integration of III-V materials may enable high performance and may prove to be highly advantageous in non linear optics, for properties not observed in group IV semiconductors. They may be useful for optical modulation, photodetectors and telecommunication applications.

The dense integrated structure capable of being developed from various embodiments may provide for a compelling solution of integrated, on-chip, low cost photonic devices.

Overall, the optical structure, along with the development methodology, may be a step forward for the field of on-chip optoelectronic system in the mid IR region.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. An optical structure comprising:
a substrate;
a core layer configured to carry mid-infrared light having a wavelength selected from a range of 2 µm to 20 µm, the core layer comprising germanium; and
an intermediate layer separating the substrate and the core layer so that the substrate is isolated from the core layer, the core layer on the intermediate layer, the intermediate layer comprising chalcogenide materials;
wherein a width of the core layer is smaller than a width of the intermediate layer;
wherein a refractive index of the core layer is greater than 4; and
wherein a refractive index of the intermediate layer is smaller than 3.6.

2. The optical structure according to claim 1, wherein the core layer comprises germanium tin (GeSn).

3. The optical structure according to claim 1, wherein the substrate comprises silicon.

4. The optical structure according to claim 1, further comprising:
a buffer layer between the substrate and the intermediate layer.

5. The optical structure according to claim 4, wherein the buffer layer comprises silicon oxide ($SiO_2$).

6. The optical structure according to claim 1, wherein the core layer is configured to carry mid-infrared light of a single mode.

7. An optical system comprising:
an optical structure comprising:
a substrate;
a core layer configured to carry mid-infrared light having a wavelength selected from a range of 2 µm to 20 µm, the core layer comprising germanium; and
an intermediate layer separating the substrate and the core layer so that the substrate is isolated from the core layer, the core layer on the intermediate layer, the intermediate layer comprising chalcogenide materials;
wherein a width of the core layer is smaller than a width of the intermediate layer;
wherein a refractive index of the core layer is greater than 4; and
wherein a refractive index of the intermediate layer is smaller than 3.6;
an optical source coupled to the optical structure.

8. A method of forming an optical structure, the method comprising:
providing a substrate;
forming a core layer configured to carry mid-infrared light having a wavelength selected from a range of 2 µm to 20 µm, the core layer comprising germanium; and
forming an intermediate layer separating the substrate and the core layer so that the substrate is isolated from the core layer, the core layer on the intermediate layer, the intermediate layer comprising chalcogenide materials;
wherein a width of the core layer is smaller than a width of the intermediate layer;
wherein a refractive index of the core layer is greater than 4; and
wherein a refractive index of the intermediate layer is smaller than 3.6.

9. The method according to claim 8, wherein the core layer is formed on a carrier.

10. The method according to claim 9, wherein the intermediate layer is formed on the core layer.

11. The method according to claim 9, further comprising:
forming a further layer on the carrier so that the carrier is between the intermediate layer and the further layer.

12. The method according to claim 11, wherein a material comprised in the further layer is same as a material comprised in the intermediate layer.

13. The method according to claim 10, further comprising:
forming a buffer layer on the intermediate layer.

14. The method according to claim 13, further comprising:
bonding the substrate to the buffer layer.

15. The method according to claim 14, further comprising:
removing the carrier such that the core layer is on the intermediate layer.

16. The method according to claim 15, wherein the carrier is removed using mechanical grinding and wet etching.

17. The method according to claim 8, further comprising:
patterning the core layer so that the width of the core layer is smaller than the width of the intermediate layer.

18. The optical structure according to claim 1, wherein the chalcogenide material is any one selected from a group consisting of titanium selenide ($TiSe_2$), zinc sulfide (ZnS), arsenic trisuphide ($As_2S_3$), arsenic triselenide ($As_2Se_3$) and iron pyrite ($FeS_2$).

19. The optical system according to claim 7, wherein the chalcogenide material is any one selected from a group consisting of titanium selenide (TiSe$_2$), zinc sulfide (ZnS), arsenic trisuphide (As$_2$S$_3$), arsenic triselenide (As$_2$Se$_3$) and iron pyrite (FeS$_2$).

20. The method according to claim 8, wherein the chalcogenide material is any one selected from a group consisting of titanium selenide (TiSe$_2$), zinc sulfide (ZnS), arsenic trisuphide (As$_2$S$_3$), arsenic triselenide (As$_2$Se$_3$) and iron pyrite (FeS$_2$).

\* \* \* \* \*